United States Patent
Saito

(10) Patent No.: US 11,320,498 B2
(45) Date of Patent: *May 3, 2022

(54) MAGNETIC-FIELD-APPLYING BIAS FILM, AND MAGNETIC DETECTION ELEMENT AND MAGNETIC DETECTOR INCLUDING THE SAME

(71) Applicant: Alps Alpine Co., Ltd., Tokyo (JP)

(72) Inventor: Masamichi Saito, Miyagi-ken (JP)

(73) Assignee: ALPS ALPINE CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/909,476

(22) Filed: Jun. 23, 2020

(65) Prior Publication Data
US 2020/0319274 A1 Oct. 8, 2020

Related U.S. Application Data

(63) Continuation of application No. PCT/JP2018/046839, filed on Dec. 19, 2018.

(30) Foreign Application Priority Data

Dec. 26, 2017 (JP) .............................. JP2017-249080

(51) Int. Cl.
*G01R 33/09* (2006.01)

(52) U.S. Cl.
CPC ......... *G01R 33/093* (2013.01); *G01R 33/098* (2013.01)

(58) Field of Classification Search
CPC .................... G01R 33/093; G01R 33/098
See application file for complete search history.

(56) References Cited

U.S. PATENT DOCUMENTS

| 7,023,670 | B2 * | 4/2006 | Saito .............. B82Y 10/00 360/324.12 |
| 10,060,992 | B2 | 8/2018 | Komasaki | |
| 2003/0103299 | A1 | 6/2003 | Saito | |
| 2016/0238674 | A1 * | 8/2016 | Komasaki ....... G01R 33/093 |
| 2020/0161538 | A1 * | 5/2020 | Saito .................. H01L 43/08 |
| 2020/0319273 | A1 * | 10/2020 | Saito .................. G01R 33/09 |

FOREIGN PATENT DOCUMENTS

| JP | 2003-338644 | 11/2003 |
| JP | 2016-151448 | 8/2016 |

OTHER PUBLICATIONS

International Search Report from corresponding International Application No. PCT/JP2018/046839, 4pgs, dated Mar. 5, 2019.
Notice of Reasons for Refusal from corresponding Japanese Patent Application No. JP 2019-561580, dated May 26, 2021, 7pp.

* cited by examiner

*Primary Examiner* — Alesa Allgood
(74) *Attorney, Agent, or Firm* — Crowell & Moring LLP

(57) ABSTRACT

A magnetic-field-applying bias film having strong-magnetic-field resistance includes an exchange coupling film. The exchange coupling film includes a ferromagnetic layer and an antiferromagnetic layer stacked on the ferromagnetic layer. The antiferromagnetic layer includes an X(Cr—Mn) layer containing Mn, Cr, and one or more elements X selected from the group consisting of platinum-group elements and Ni. The X(Cr—Mn) layer has a first region relatively close to the ferromagnetic layer and a second region relatively far from the ferromagnetic layer. The Mn content in the first region is higher than the Mn content in the second region.

15 Claims, 16 Drawing Sheets

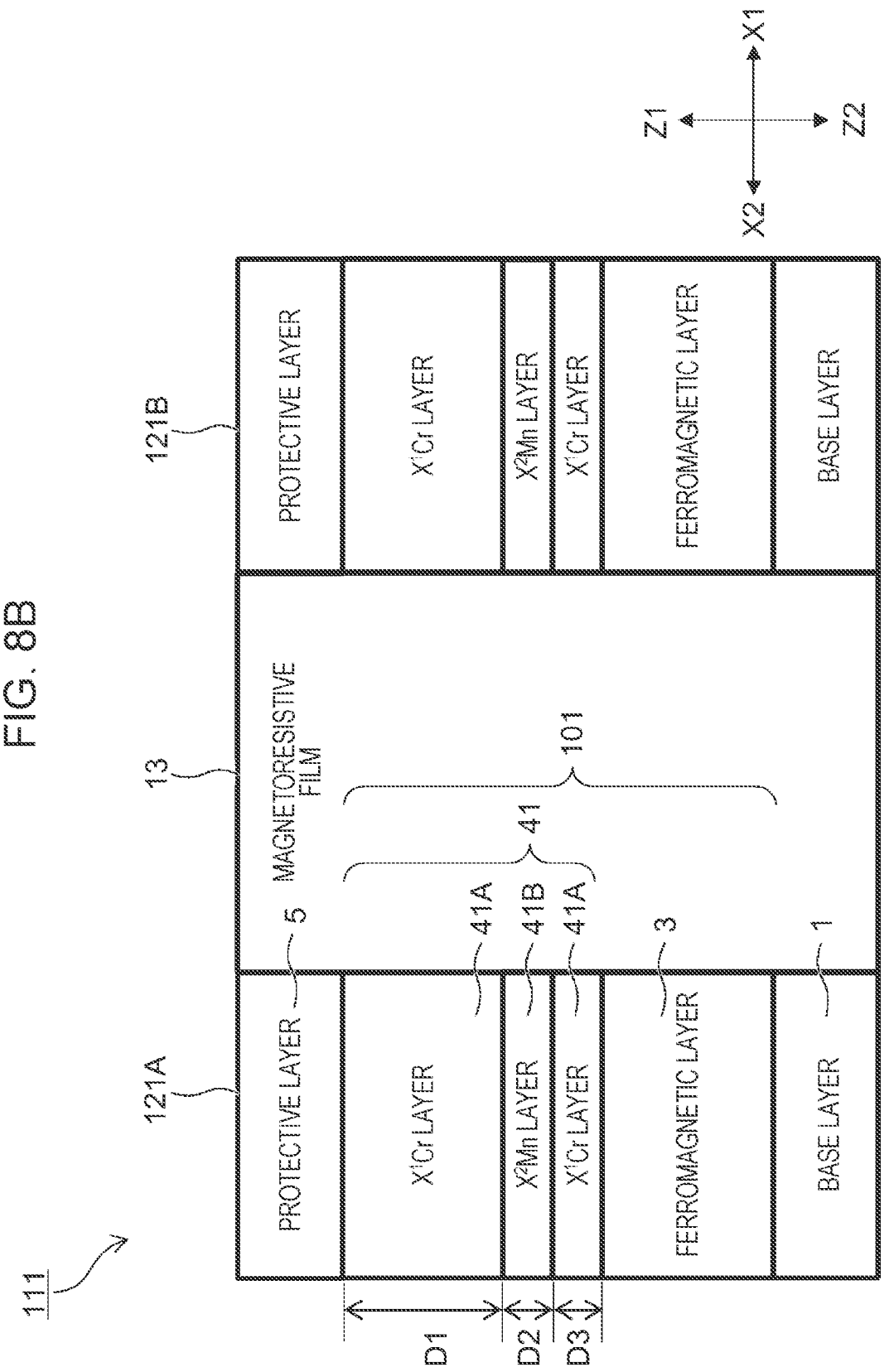

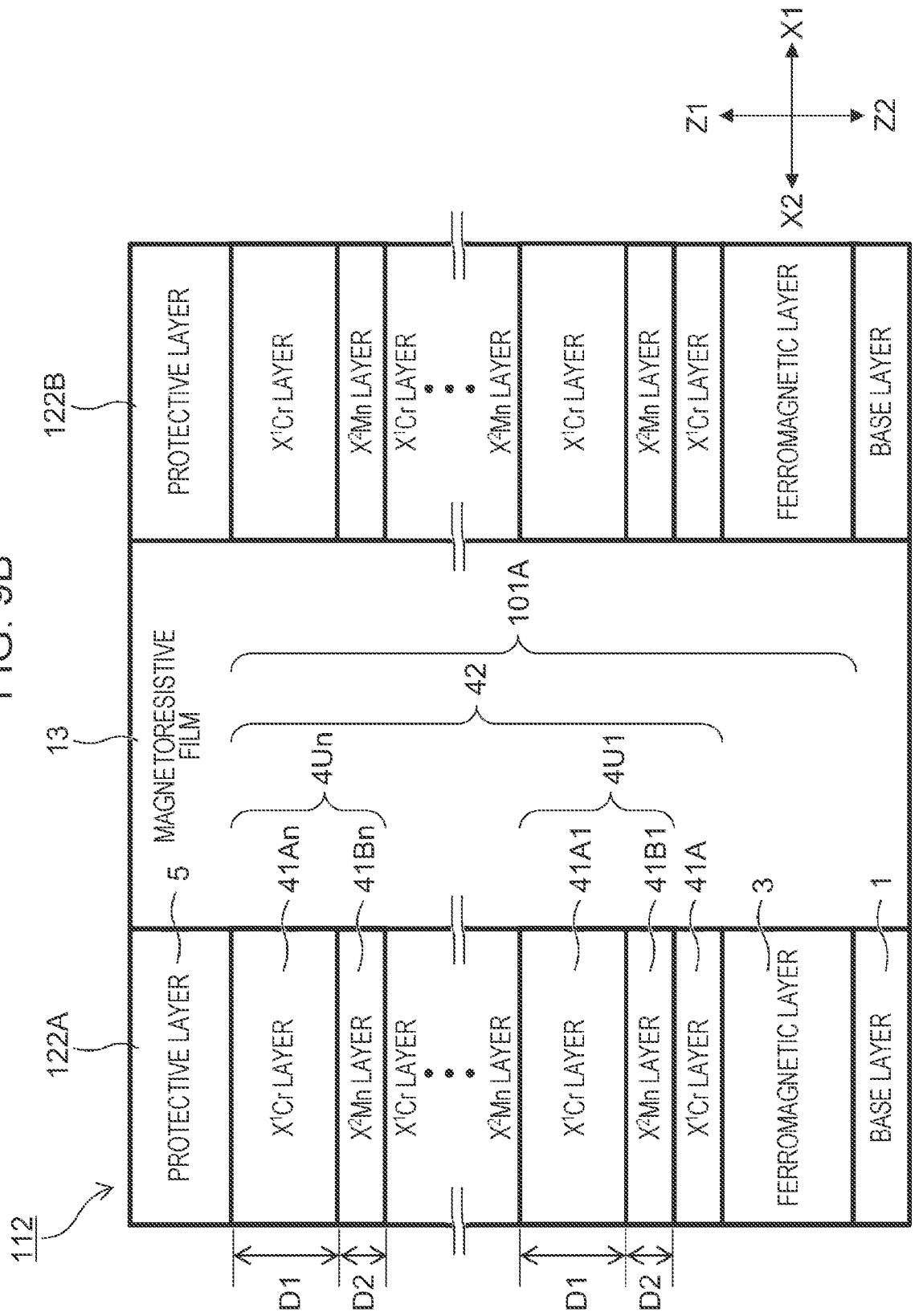

MAGNETIC-FIELD-APPLYING BIAS FILM, AND MAGNETIC DETECTION ELEMENT AND MAGNETIC DETECTOR INCLUDING THE SAME

CLAIM OF PRIORITY

This application is a Continuation of International Application No. PCT/JP2018/046839 filed on Dec. 19, 2018, which claims benefit of priority to Japanese Patent Application No. 2017-249080 filed on Dec. 26, 2017. The entire contents of each application noted above are hereby incorporated by reference.

BACKGROUND

1. Field of the Disclosure

The present disclosure relates to a magnetic-field-applying bias film, and a magnetic detection element and a magnetic detector including the magnetic-field-applying bias film.

2. Description of the Related Art

In a magnetic detector (magnetic sensor), which includes a magnetic detection element having a magnetic detection unit that has a magnetoresistive film, the magnetoresistive film, which includes a pinned magnetic layer and a free magnetic layer. The direction of magnetization of the free magnetic layer when in a state where no external magnetic field is applied is preferably aligned to accomplish higher measurement accuracy. A biasing magnetic field is used for aligning the direction of magnetization of a free magnetic layer in a state where no external magnetic field is applied. In some magnetic detection elements, a magnetic-field-applying bias film is disposed in a peripheral area of a magnetic detection unit. Here the magnetic-field-applying bias film includes an exchange coupling film, which has a stack of an antiferromagnetic layer formed of an antiferromagnetic material such as IrMn or PtMn and a ferromagnetic layer. (see, for example, Japanese Unexamined Patent Application Publication No. 2016-151448).

A magnetic detector requires a solder reflow process (melting process) when a magnetoresistive element is mounted on a substrate, and in this process, the magnetoresistive element is also heated to about 300° C. A magnetic detector may be used in a high-temperature environment such as in the vicinity of an engine. Thus, a magnetic-field-applying bias film used in a magnetic detector can preferably apply a biasing magnetic field to a free magnetic layer in a stable manner even in a high-temperature environment. It has recently been required that the direction in which a biasing magnetic field is applied (the bias application direction) be less influenced when a magnetic-field-applying bias film is disposed near a strong magnetic field source, such as a high-power motor, and subjected to a strong magnetic field. That is, strong-magnetic-field resistance has been required.

SUMMARY

The present disclose provides a magnetic-field-applying bias film that includes an exchange coupling film including a stack of an antiferromagnetic layer and a ferromagnetic layer and that is highly stable under high-temperature conditions and moreover has high strong-magnetic-field resistance. The present disclosure also provides a magnetic detection element including the magnetic-field-applying bias film and a magnetic detector including the magnetic-field-applying bias film.

A magnetic-field-applying bias film includes an exchange coupling film. The exchange coupling film includes a ferromagnetic layer and an antiferromagnetic layer stacked on the ferromagnetic layer. The antiferromagnetic layer includes an X(Cr—Mn) layer containing Mn, Cr, and one or more elements X selected from the group consisting of platinum-group elements and Ni. The X(C—Mn) layer has a first region relatively close to the ferromagnetic layer and a second region relatively far from the ferromagnetic layer. The Mn content in the first region is higher than the Mn content in the second region.

In the above-described magnetic-field-applying bias film, the first region may be in contact with the ferromagnetic layer.

In the above-described magnetic-field-applying bias film, the first region may have a portion where a Mn/Cr ratio of Mn content to Cr content is 0.3 or more. In this case, the first region preferably has a portion where the Mn/Cr ratio is 1 or more.

Another aspect of the present disclosure provides a magnetic-field-applying bias film including an exchange coupling film. The exchange coupling film includes a ferromagnetic layer and an antiferromagnetic layer stacked on the ferromagnetic layer. The antiferromagnetic layer has an alternately stacked structure in which an X1Cr layer (where X1 represents one or more elements selected from the group consisting of platinum-group elements and Ni) and an X2Mn layer (where X2 represents one or more elements selected from the group consisting of platinum-group elements and Ni and may be the same as or different from X1) are alternately stacked in three or more layers.

Another aspect of the present disclosure provides a magnetic detection element including a magnetic detection unit and the above-described magnetic-field-applying bias film. The magnetic detection unit includes a magnetoresistive film including a pinned magnetic layer and a free magnetic layer. The magnetic-field-applying bias film is disposed in a peripheral area of the magnetic detection unit so that the free magnetic layer is magnetized in an aligned direction in a state where no external magnetic field is applied to the free magnetic layer.

Another aspect of the present disclosure provides a magnetic detector including the above-described magnetic detection element. In the magnetic detector, a plurality of the above-described magnetic detection elements may be disposed on a single substrate. The plurality of the magnetic detection elements may include pinned magnetic layers having different pinned magnetization directions.

According to the present invention, a magnetic-field-applying bias film having high strong-magnetic-field resistance in a high-temperature environment is provided. Therefore, by using the magnetic-field-applying bias film of the present invention, a magnetic detector that is stable in a high-temperature environment where a strong magnetic field is applied can be provided.

BRIEF DESCRIPTION OF THE DRAWINGS

FIG. 2A is a view in Z1-Z2 direction, and FIG. 2B is a view in Y1-Y2 direction;

FIGS. 8A and 8B illustrate a configuration of a magnetic detection element according to a second embodiment of the present invention; FIG. 8A is a view in Z1-Z2 direction, and FIG. 8B is a view in Y1-Y2 direction;

FIGS. 9A and 9B illustrate a configuration of a magnetic detection element according to a modification of the second embodiment of the present invention; FIG. 9A is a view in Z1-Z2 direction, and FIG. 9B is a view in Y1-Y2 direction;

DESCRIPTION OF THE EXEMPLARY EMBODIMENTS

Figure 1:
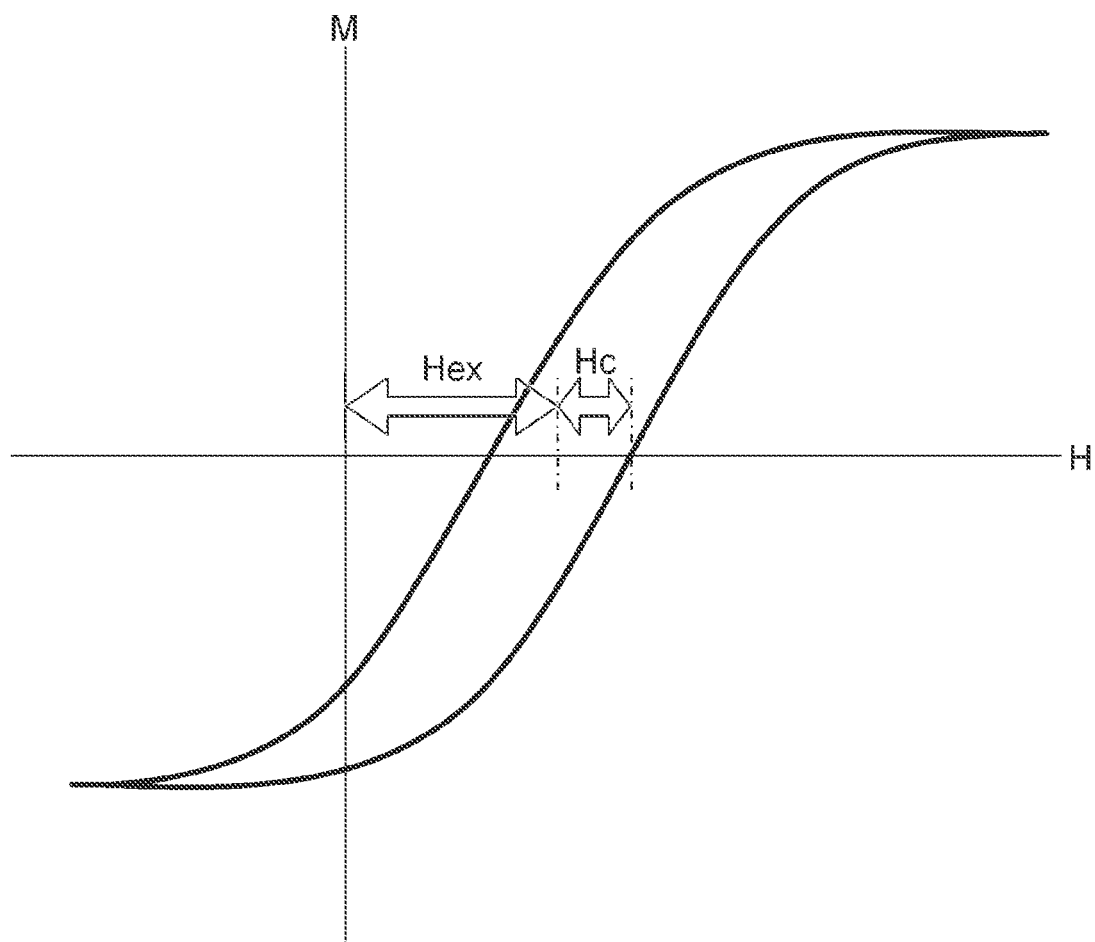
FIG. 1 is a graph illustrating a hysteresis loop of a magnetization curve of a magnetic-field-applying bias film according to the present invention.

FIG. 1 is a graph illustrating a hysteresis loop of a magnetization curve of the exchange coupling film according to the present invention. In general, a hysteresis loop formed by an M-H curve (magnetization curve) of a soft magnetic material is symmetric with respect to the intersection of the H-axis and the M-axis (magnetic field H=0 A/m, magnetization M=0 A/m). However, as illustrated in FIG. 1, since an exchange coupling magnetic field Hex acts on the ferromagnetic layer exchange-coupled with the antiferromagnetic layer, the hysteresis loop of the exchange coupling film according to the present invention has a shape shifted along the H-axis according to the magnitude of the exchange coupling magnetic field Hex. In the ferromagnetic layer of the exchange coupling film, the larger the exchange coupling magnetic field Hex is, the less likely the direction of magnetization is to be reversed when an external magnetic field is applied; thus, the magnetic-field-applying bias film including the exchange coupling film has a good bias function (a function to appropriately apply a biasing magnetic field to a free magnetic layer of the magnetic detection element).

When a coercive force Hc, which is defined as a difference between the center of the hysteresis loop shifted along the H-axis (the magnetic field strength at the center corresponds to the exchange coupling magnetic field Hex) and the intercept of the hysteresis loop with the H axis, is smaller than the exchange coupling magnetic field Hex, even if an external magnetic field is applied and a pinned magnetic layer of the exchange coupling film is magnetized along the direction of the external magnetic field, the exchange coupling magnetic field Hex stronger than the coercive force Hc enables alignment of the direction of magnetization of the free magnetic layer and exertion of the bias function when the application of the external magnetic field is stopped. That is, when the relationship between the exchange coupling magnetic field Hex and the coercive force Hc is Hex>Hc, the magnetic-field-applying bias film including the exchange coupling film has good strong-magnetic-field resistance.

Moreover, the antiferromagnetic layer of the above-described exchange coupling film has a higher blocking temperature Tb than antiferromagnetic layers formed of known antiferromagnetic materials, such as IrMn and PtMn, described in Japanese Unexamined Patent Application Publication No. 2016-151448, and thus can maintain the exchange coupling magnetic field Hex when the antiferromagnetic layer is placed, for example, in an environment at about 300° C. and subjected to a strong magnetic field. Therefore, the magnetic-field-applying bias film including the above-described exchange coupling film is highly stable in a high-temperature environment and has strong-magnetic-field resistance.

Figure 2A:
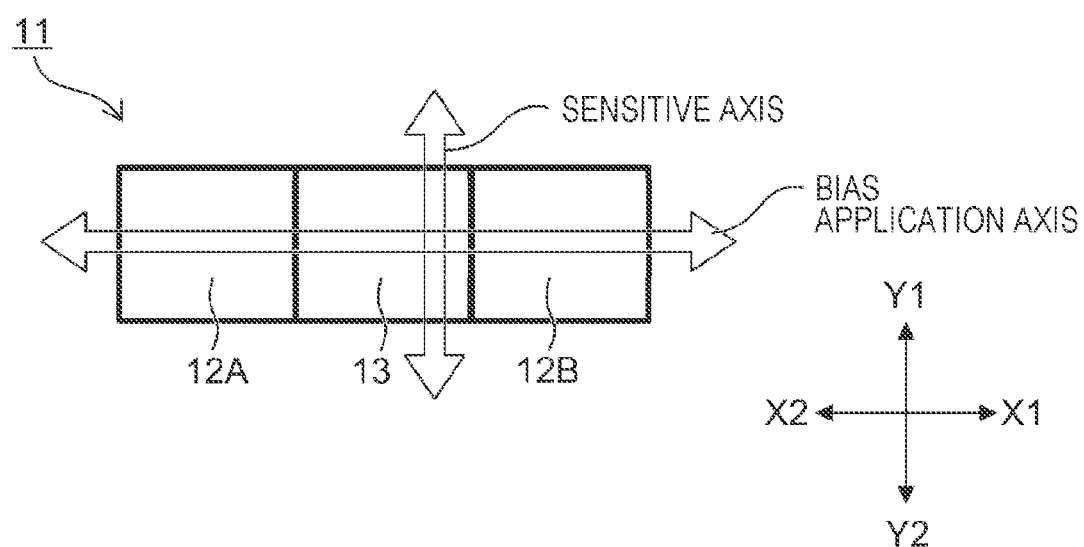
FIGS. 2A and 2B illustrate a configuration of a magnetic detection element according to a first embodiment of the present invention.
Figure 2B:
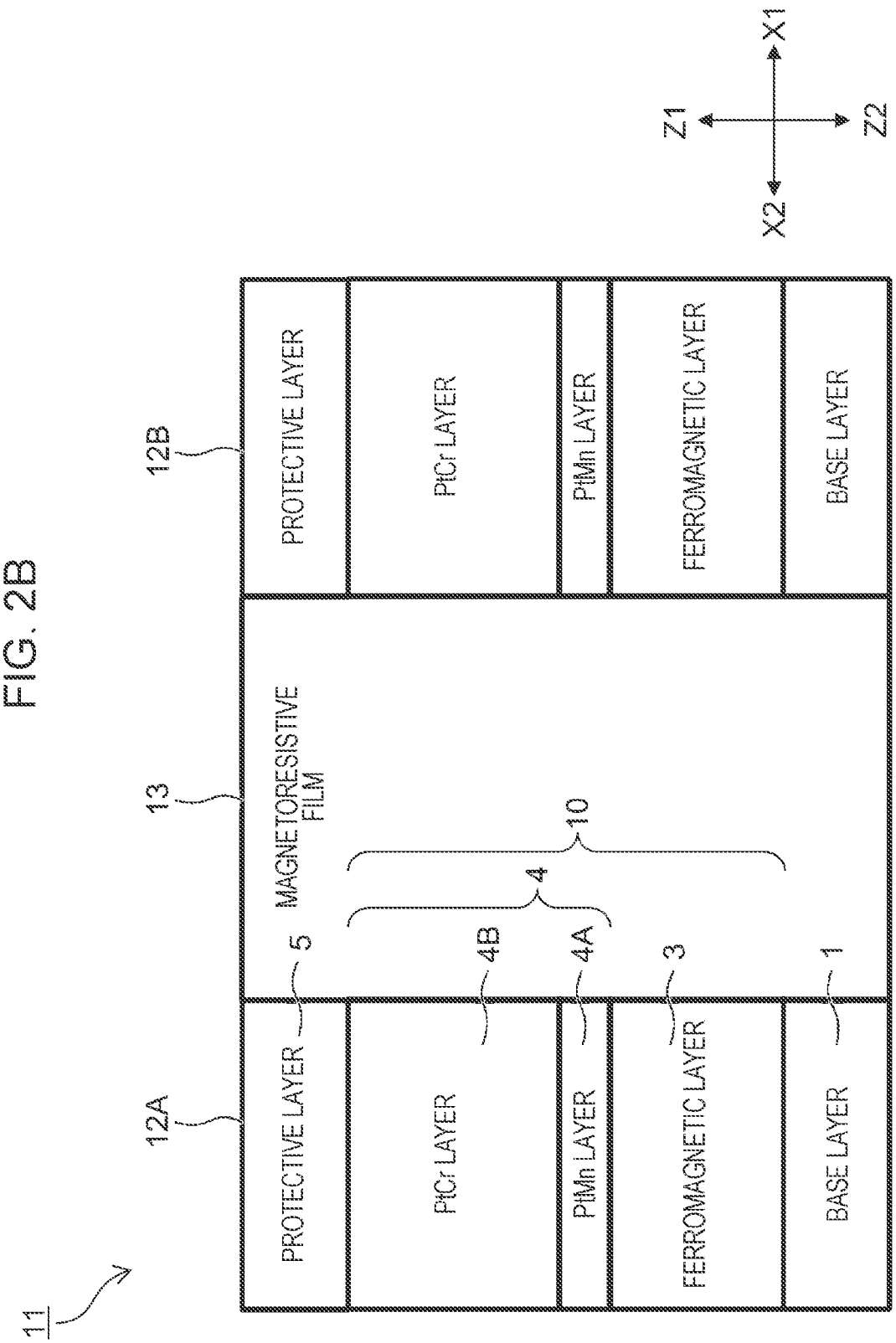

FIGS. 2A and 2B schematically illustrate a structure of a magnetic detection element according to a first embodiment of the present invention.

A magnetic detection element 11 according to this embodiment includes a magnetic detection unit 13 including a magnetoresistive film having a sensitive axis along a Y1-Y2 direction in FIG. 2A and includes magnetic-field-applying bias films located in peripheral areas of the magnetic detection unit 13, specifically, a magnetic-field-applying bias film 12A located on the X2 side in an X1-X2 direction perpendicular to the sensitive axis of the magnetic detection unit 13 and a magnetic-field-applying bias film 12B located on the X1 side in the X1-X2 direction of the magnetic detection unit 13. The magnetoresistive film may be of any type as long as it includes a pinned magnetic layer and a free magnetic layer. The magnetoresistive film may be a giant magnetoresistive film (GMR film) or a tunnel magnetoresistive film (TMR film). This also applies to other embodiments.

The magnetic-field-applying bias films 12A and 12B each has a structure in which a base layer 1, a ferromagnetic layer 3, an antiferromagnetic layer 4, and a protective layer 5 are stacked from the Z2 side in Z1-Z2 direction toward the Z1 side in Z1-Z2 direction. The ferromagnetic layer 3 and the antiferromagnetic layer 4 constitute an exchange coupling film 10.

The ferromagnetic layer 3 is formed of a ferromagnetic material such as a CoFe alloy (cobalt-iron alloy). CoFe alloys having higher Fe contents have higher coercive forces Hc. The ferromagnetic layer 3 preferably has a thickness of 12 Å or more and 30 Å or less.

The antiferromagnetic layer 4 of the magnetic-field-applying bias films 12A and 12B according to this embodiment is formed by stacking a PtMn layer 4A and a PtCr layer 4B from the side close to the ferromagnetic layer 3. These layers are each formed, for example, by a sputtering process or a CVD process. When an alloy layer such as the PtMn layer 4A of the magnetic-field-applying bias films 12A and 12B is formed, a plurality of metals (Pt and Mn, in the case of the PtMn layer 4A) forming the alloy may be simultaneously supplied, or the plurality of metals forming the alloy may be alternately supplied. A specific example of the former method is co-sputtering of the plurality of metals forming the alloy, and a specific example of the latter method is alternate stacking of different metal films. To provide a higher exchange coupling magnetic field Hex, simultaneous supply of the plurality of metals forming the alloy may be preferred to alternate supply.

After being formed, the antiferromagnetic layer 4 is ordered by annealing and exchange-coupled with the ferromagnetic layer 3, thus generating an exchange coupling magnetic field Hex in the ferromagnetic layer 3. The antiferromagnetic layer 4 has a higher blocking temperature Tb than antiferromagnetic layers formed of IrMn and antiferromagnetic layers formed of PtMn known in the art, and thus the exchange coupling film 10 can maintain the exchange coupling magnetic field Hex at a high level in a high-temperature environment. As a result of the above annealing, atoms of the layers constituting the antiferromagnetic layer 4 are interdiffused.

The antiferromagnetic layer 4 of the exchange coupling film 10 according to this embodiment includes an X(Cr—Mn) layer containing Mn, Cr, and one or more elements X selected from the group consisting of platinum-group elements and Ni. The antiferromagnetic layer 4 having a stacked structure illustrated in FIG. 2B is a Pt(Cr—Mn) layer, since the element X is Pt. The Pt(Cr—Mn) layer has a first region relatively close to the ferromagnetic layer 3 and a second region relatively far from the ferromagnetic layer 3, and the Mn content in the first region is higher than the Mn content in the second region. The Pt(Cr—Mn) layer having such a structure is formed by annealing a stack of the PtMn layer 4A and the PtCr layer 4B. By performing a surface analysis while performing sputtering, a content distribution (depth profile) of the constituent elements in the depth direction can be obtained.

Figure 3:
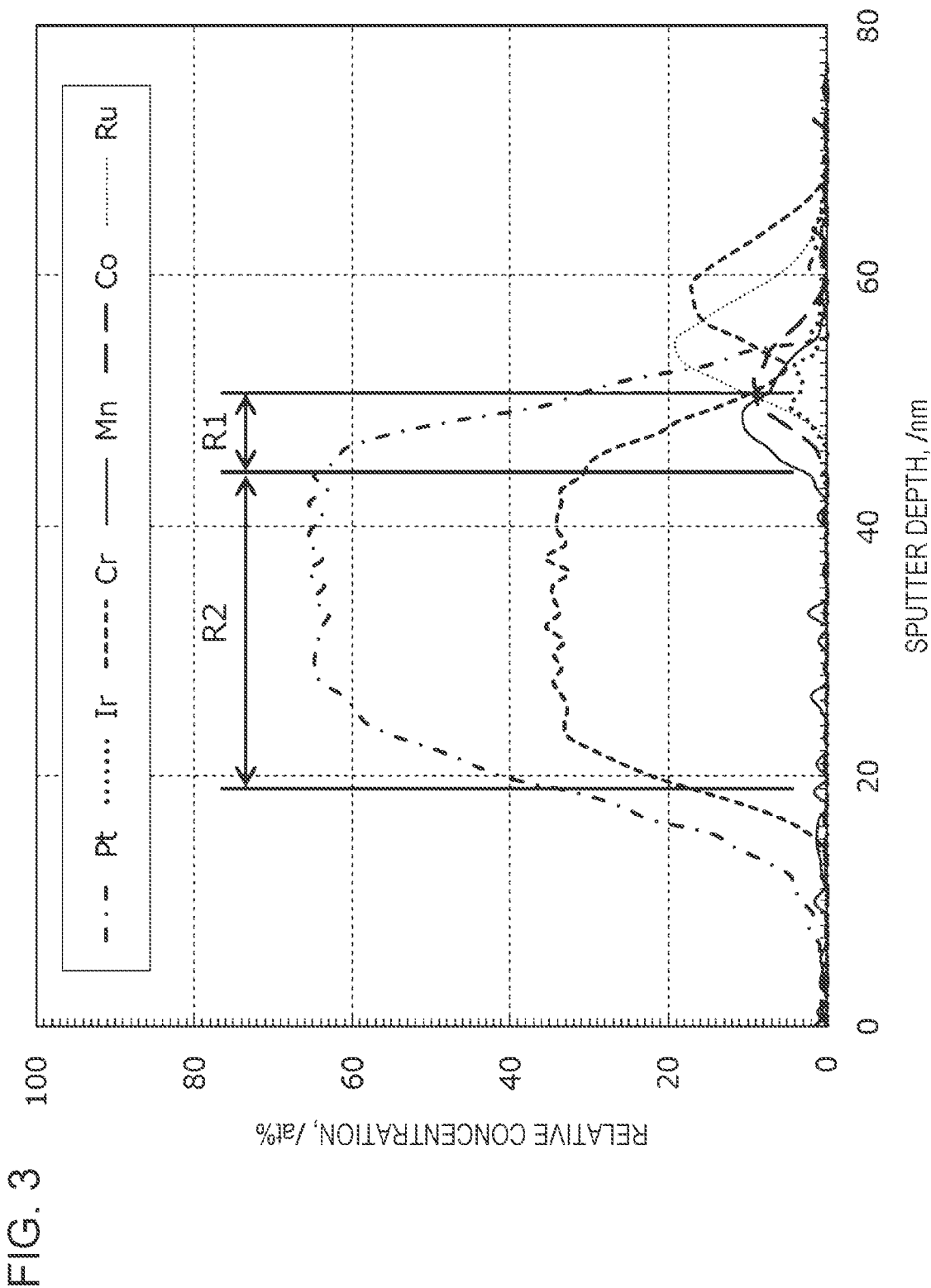
FIG. 3 is an example of a depth profile.

FIG. 3 is an example of a depth profile a film including an exchange coupling film 10 having a configuration similar to that of the exchange coupling film 10 according to this embodiment. The exchange coupling film in this film is constituted by a pinned magnetic layer and an antiferromagnetic layer. The depth profile shown in FIG. 3 was obtained from a film formed by annealing a film having the following configuration in a magnetic field at 15 kOe at 350° C. for 20 hours. Numerical values in parentheses indicate thicknesses (Å).

Substrate/base layer: NiFeCr (40)/nonmagnetic material layer: [Cu (40)/Ru (20)]/pinned magnetic layer: Co40at%Fe60at% (20)/antiferromagnetic layer [IrMn layer: Ir22at%Mn78at% (10)/PtMn layer: Pt50at%Mn 50at% (16)/PtCr layer: Pt51at%Cr49at% (300)]/protective layer: Ta (100)

Specifically, the depth profile in FIG. 3 indicates a Pt, Ir, Cr, and Mn content distribution in the depth direction obtained by performing a surface analysis with an Auger electron spectrometer while performing argon sputtering from the protective layer side. The argon sputtering rate, which was determined in terms of SiO2, was 1.1 nm/min.

Figure 4:
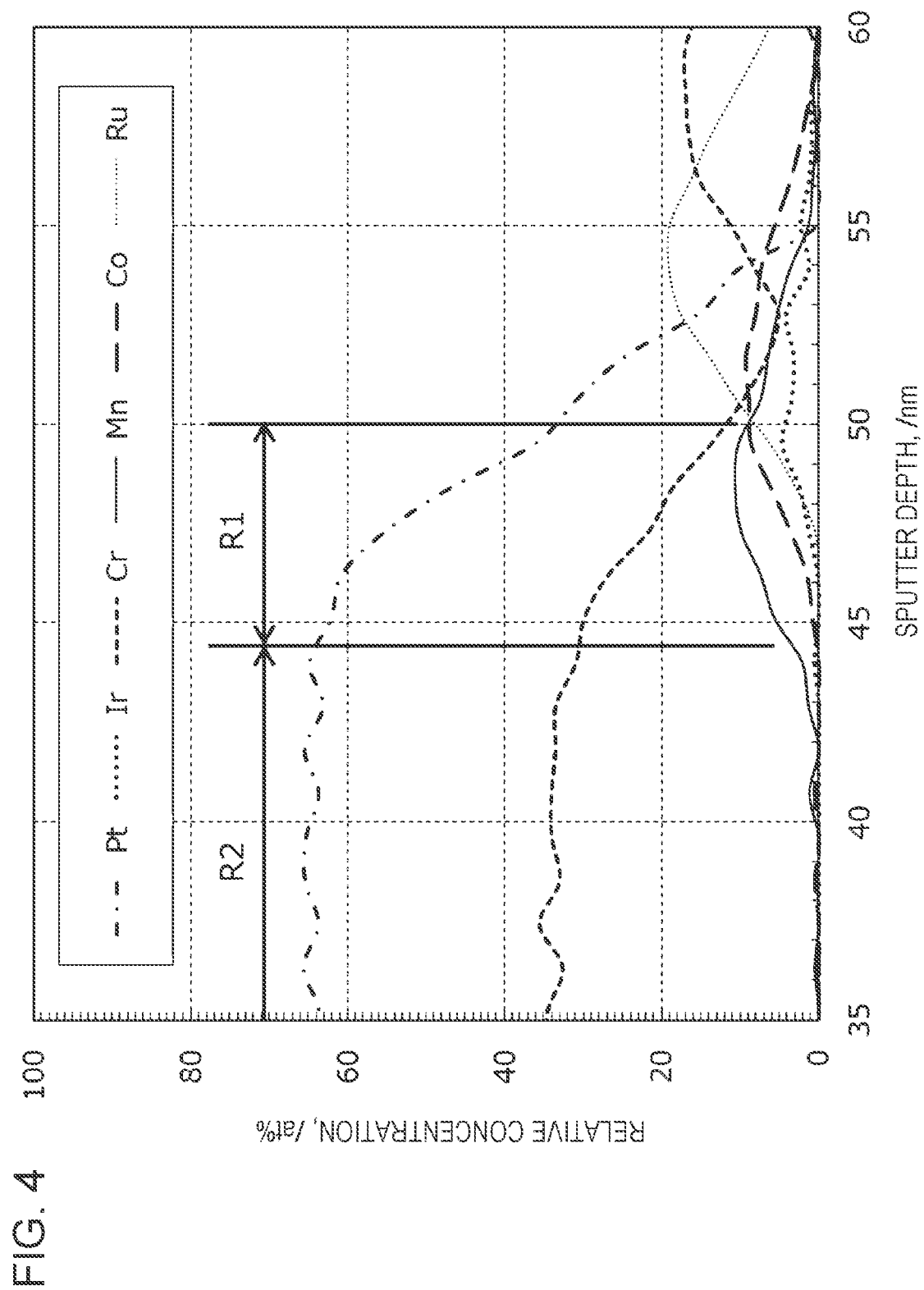
FIG. 4 is an enlarged profile showing a part of the depth profile in FIG. 3.

FIG. 4 is a partially enlarged view of FIG. 3. In both FIG. 3 and FIG. 4, to determine the depth positions of the pinned magnetic layer and the nonmagnetic material layer, the content distribution of Co (one of the constituent elements of the pinned magnetic layer) and the content distribution of Ru (an element constituting the antiferromagnetic layer side of the nonmagnetic material layer) are also included in the depth profile.

As illustrated in FIG. 3, the antiferromagnetic layer has a thickness of about 30 nm and includes an X(Cr—Mn) layer containing Pt and Ir, which are elements X selected from the group consisting of platinum-group elements and Ni, and Mn and Cr, specifically, a (Pt—Ir)(Cr—Mn) layer. The X(Cr—Mn) layer ((Pt—Ir)(Cr—Mn) layer) has a first region R1 relatively close to the pinned magnetic layer and a second region R2 relatively far from the pinned magnetic layer, and the Mn content in the first region R1 is higher than the Mn content in the second region R2. Such a structure can be obtained by appropriately stacking a layer formed of XCr, a layer formed of XMn, and the like to form a multilayer stack and annealing the multilayer stack as described above.

Figure 5:
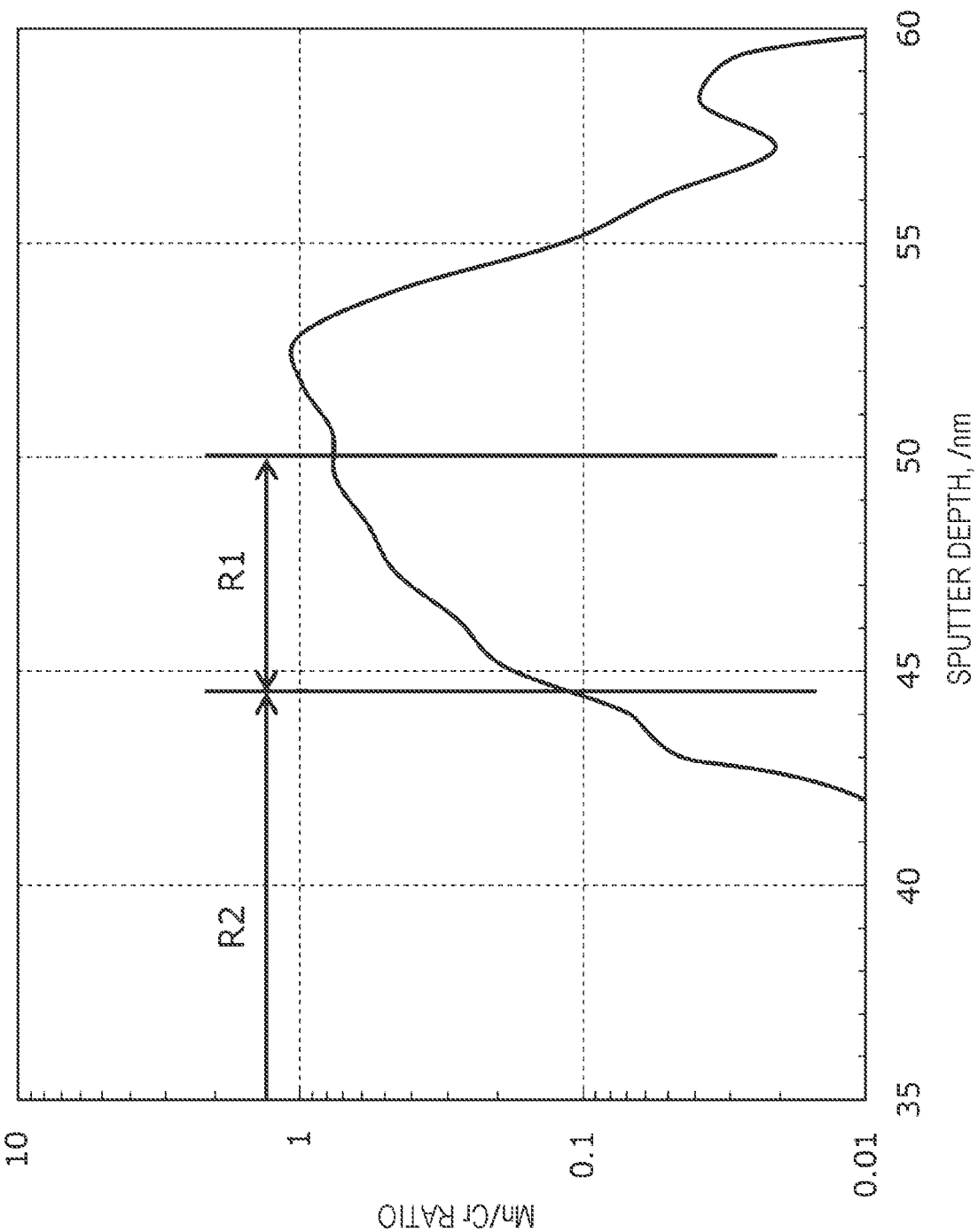
FIG. 5 is a graph showing the ratio of Mn content to Cr content (Mn/Cr ratio) determined on the basis of FIG. 4, with the range of the horizontal axis being the same as in FIG. 4.

FIG. 5 is a graph showing the ratio of Mn content to Cr content (Mn/Cr ratio) calculated on the basis of the Mn content and the Cr content at each depth determined from the depth profile, with the range of the horizontal axis being the same as in FIG. 4. On the basis of the results shown in FIG. 5, the depth at which the Mn/Cr ratio is 0.1 is herein defined as a boundary between the first region R1 and the second region R2. That is, in the antiferromagnetic layer, the first region R1 is defined as a region which is closer to the pinned magnetic layer and in which the Mn/Cr ratio is 0.1 or more, and the second region is defined as a region of the antiferromagnetic layer other than the first region. According to these definitions, the boundary between the first region R1 and the second region R2 is located at a depth of about 44.5 nm in the depth profile shown in FIG. 3.

A large Mn/Cr ratio influences the magnitude of the exchange coupling magnetic field Hex, and in addition, the larger the Mn/Cr ratio, the more likely it is that the value of Hex/Hc will be positive and that the absolute value thereof will be large. Specifically, the first region R1 preferably has a portion where the Mn/Cr ratio is 0.3 or more, more preferably has a portion where the Mn/Cr ratio is 0.7 or more, particularly preferably has a portion where the Mn/Cr ratio is 1 or more.

As described above, since Mn is contained in a relatively large amount in the first region R1, the magnetic-field-applying bias films 12A and 12B according to this embodiment can generate a high exchange coupling magnetic field Hex. On the other hand, since the second region R2 has a low Mn content and a relatively high Cr content, the antiferromagnetic layer 4 has a high blocking temperature Tb. For these reasons, the magnetic-field-applying bias films 12A and 12B according to this embodiment are less likely to lose their bias function even if placed in a high-temperature environment.

The base layer 1 and the protective layer 5 are formed of, for example, tantalum (Ta). A stack of a ferromagnetic layer and a nonmagnetic layer (e.g., Ru and Cu) may be disposed between the base layer 1 and the ferromagnetic layer 3.

While, in the antiferromagnetic layer 4 of the magnetic-field-applying bias films 12A and 12B according to this embodiment described above, the PtMn layer 4A is stacked so as to be in contact with the ferromagnetic layer 3 and the PtCr layer 4B is stacked on the PtMn layer 4A, the PtMn layer 4A is a specific example of an X0Mn layer (where X0 represents one or more elements selected from the group consisting of platinum-group elements and Ni). That is, in the magnetic-field-applying bias films 12A and 12B, the X0Mn layer has a single-layer structure, and X0 is Pt. X0 may be an element other than Pt, and the X0Mn layer may be formed of a stack of multiple layers. Specifically, for example, the X0Mn layer may be an IrMn layer or a stack of an IrMn layer and a PtMn layer disposed in this order from the side close to the ferromagnetic layer 3. Alternatively, for example, the X0Mn layer may be a stack of a PtMn layer, an IrMn layer, and a PtMn layer disposed in this order from the side close to the ferromagnetic layer 3.

While the magnetic-field-applying bias films 12A and 12B according to this embodiment described above have a structure in which the antiferromagnetic layer 4 is stacked on the ferromagnetic layer 3, the order of stacking may be reversed. That is, the magnetic-field-applying bias films 12A and 12B may have a structure in which the ferromagnetic layer 3 is stacked on the antiferromagnetic layer 4.

In the magnetic detection element 11 according to this embodiment described above, the two magnetic-field-applying bias films 12A and 12B are disposed so as to align in the X1-X2 direction perpendicular to the sensitive axis direction (the Y1-Y2 direction), and the exchange coupling magnetic field directions (Hex directions) of the ferromagnetic layers 3 of the two films are both aligned in the X1-X2 direction. Thus, the direction of a bias application axis is oriented perpendicularly to the sensitive axis direction (the Y1-Y2 direction) of the magnetic detection unit 13. As described in Japanese Unexamined Patent Application Publication No. 2016-151448, by adjusting the relative position between the magnetic detection unit 13 and the two magnetic-field-applying bias films 12A and 12B in the magnetic detection element 11 or the exchange coupling magnetic field directions (Hex directions) of the ferromagnetic layers 3 of the two magnetic-field-applying bias films 12A and 12B, the bias application axis can be set in any desired direction.

Figure 6A:
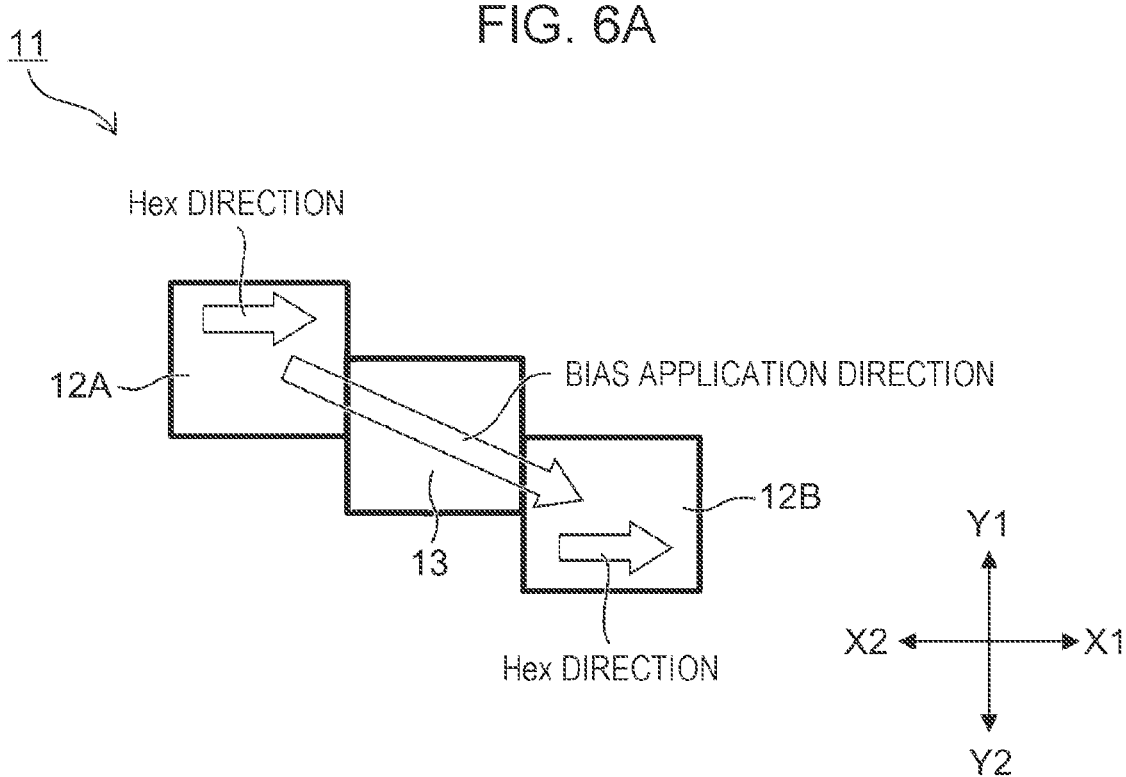
FIGS. 6A and 6B illustrate a configuration of a magnetic detection element according to a modification of the first embodiment of the present invention.

Specifically, for example, setting of the bias application axis using such an adjustment can be performed as described below. As illustrated in FIG. 6A, the directions of exchange coupling magnetic fields Hex (designated as "Hex directions" in the figure, hereinafter the same) generated in the ferromagnetic layers 3 of the two magnetic-field-applying bias films 12A and 12B are both oriented toward the X1 side in X1-X2 direction. The bias application direction (the direction in which a biasing magnetic field is applied) can be inclined from the X2 side in X1-X2 direction toward the Y2 side in Y1-Y2 direction by disposing the magnetic-field-applying bias film 12A located on the X2 side in X1-X2 direction of the magnetic detection unit 13 on the Y1 side in Y1-Y2 direction and disposing the magnetic-field-applying bias film 12B located on the X1 side in X1-X2 direction of the magnetic detection unit 13 on the Y2 side in Y1-Y2 direction.

Figure 6B:
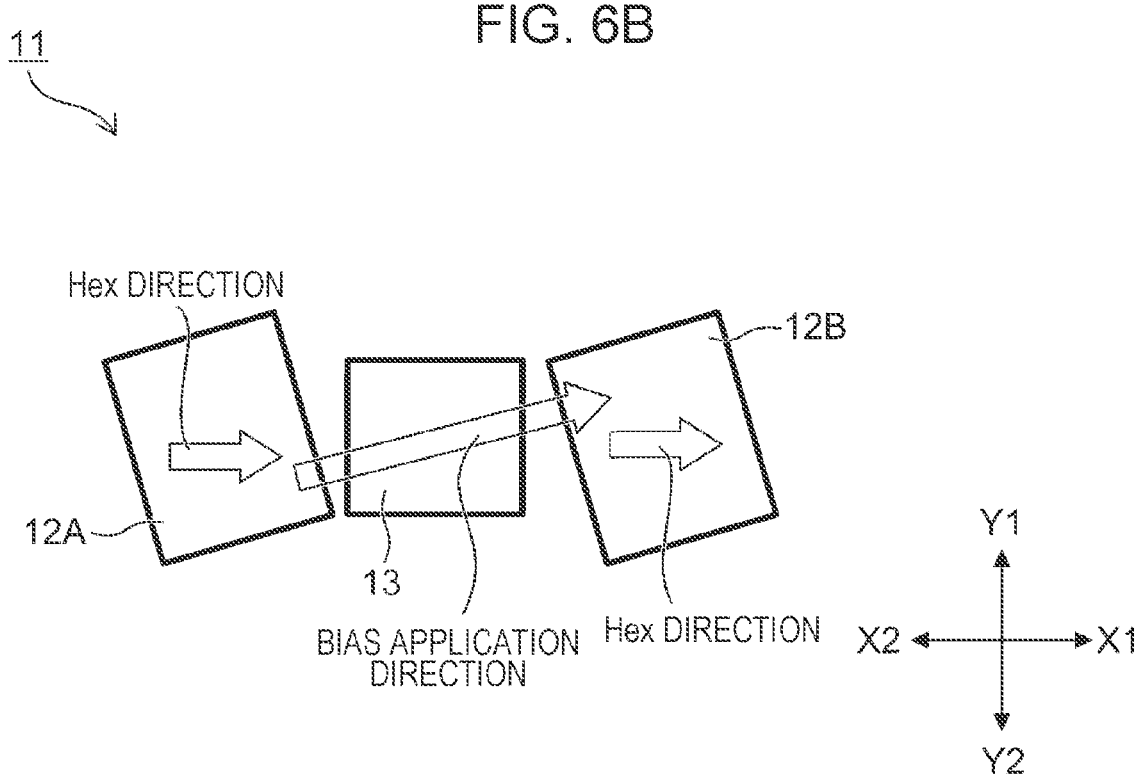

As illustrated in FIG. 6B, the two magnetic-field-applying bias films 12A and 12B are disposed so as to align in X1-X2 direction of the magnetic detection unit 13, and, moreover, the Hex directions of the two magnetic-field-applying bias films 12A and 12B are both oriented toward the X1 side in X1-X2 direction. The bias application direction can be inclined from the X2 side in X1-X2 direction toward the Y1 side in Y1-Y2 direction by adjusting the shape of the magnetic-field-applying bias films 12A and 12B such that the magnetic-field-applying bias film 12A located on the X2 side in X1-X2 direction of the magnetic detection unit 13 is disposed so as to come closer to the magnetic detection unit 13 toward the Y2 side in Y1-Y2 direction and that the magnetic-field-applying bias film 12B located on the X1 side in X1-X2 direction of the magnetic detection unit 13 is disposed so as to come closer to the magnetic detection unit 13 toward the Y1 side in Y1-Y2 direction.

Figure 7A:
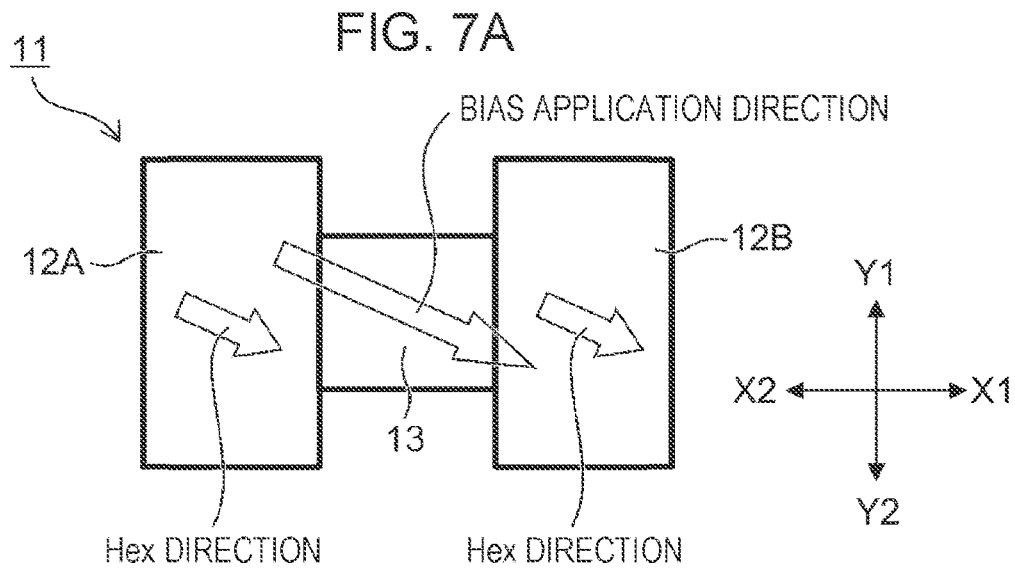
FIGS. 7A and 7B illustrate a configuration of a magnetic detection element according to another modification of the first embodiment of the present invention.

Alternatively, as illustrated in FIG. 7A, when the two magnetic-field-applying bias films 12A and 12B are formed so as to align in X1-X2 direction of the magnetic detection unit 13, and the Hex directions of the ferromagnetic layers 3 of the two magnetic-field-applying bias films 12A and 12B are oriented toward the X1 side in X1-X2 direction and inclined toward the Y2 side in Y1-Y2 direction, the bias application direction in the magnetic detection unit 13 located between the two magnetic-field-applying bias films 12A and 12B can be set to be the same as the Hex directions.

Figure 7B:
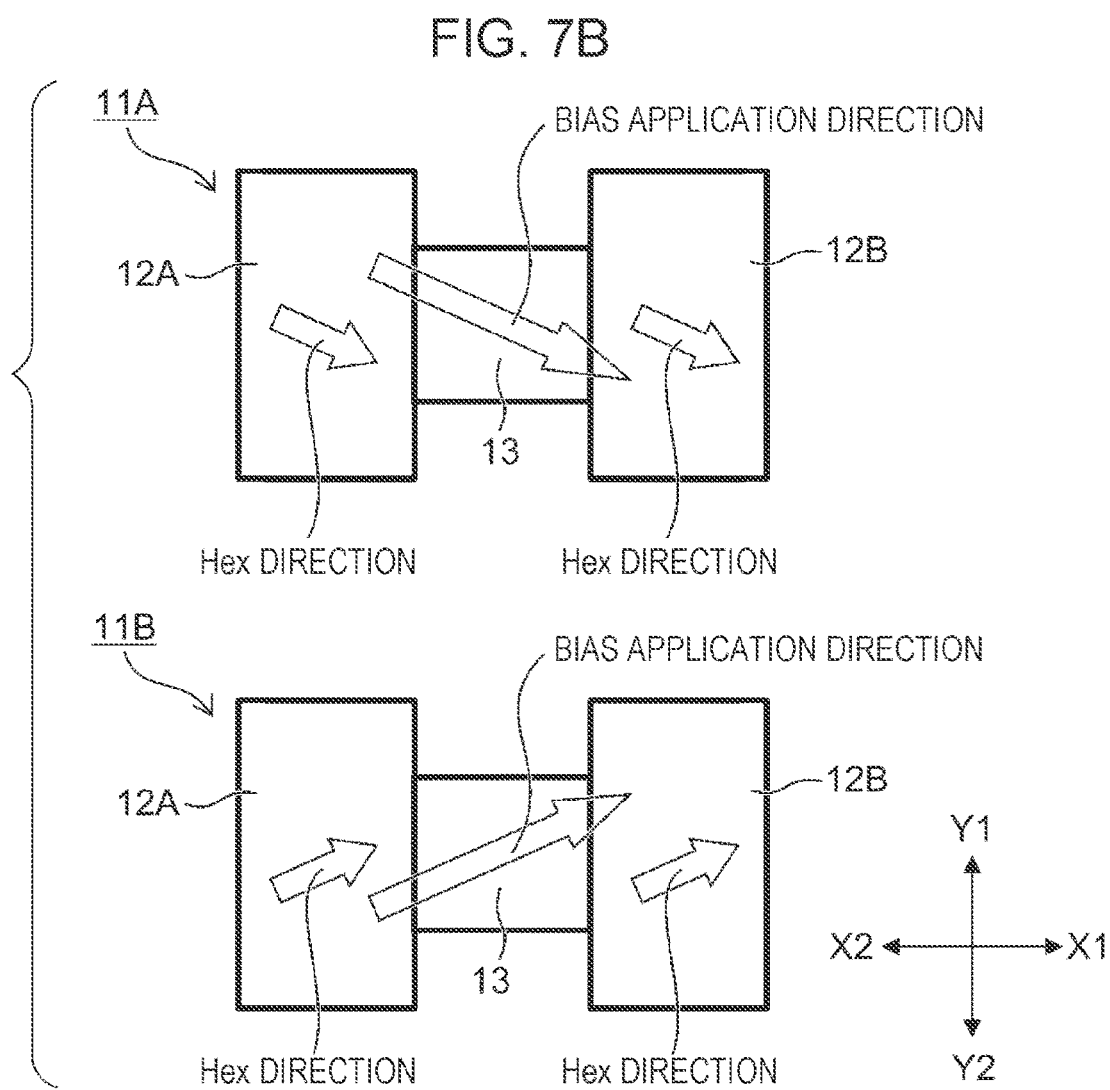

Here, as described above, the antiferromagnetic layer 4 according to this embodiment has a higher blocking temperature Tb than antiferromagnetic layers formed of, for example, IrMn known in the art, and thus even when two magnetic detection elements 11A and 11B are disposed in proximity to each other, the bias application direction in the magnetic detection element 11A and the bias application direction in the magnetic detection element 11B can be oriented in different directions by using a difference in blocking temperature Tb, as illustrated in FIG. 7B.

Specifically, the exchange coupling film 10 according to this embodiment is used as an exchange coupling film of the magnetic-field-applying bias films 12A and 12B of the magnetic detection element 11A, and an exchange coupling film including an antiferromagnetic layer formed of IrMn known in the art is used as an exchange coupling film of the magnetic-field-applying bias films 12A and 12B of the magnetic detection element 11B. The blocking temperature Tb of the antiferromagnetic layer 4 of the exchange coupling film 10 according to this embodiment is about 500° C., whereas the blocking temperature Tb of the antiferromagnetic layer formed of IrMn is about 300° C. Therefore, if annealing in a magnetic field is performed, for example, at 400° C., an exchange coupling magnetic field Hex is generated in both the magnetic-field-applying bias films 12A and 12B of the magnetic detection element 11A and the magnetic-field-applying bias films 12A and 12B of the magnetic detection element 11B in the same direction, i.e., in the direction of the magnetic field in the 400° C. annealing.

If annealing in a magnetic field is then performed at a temperature higher than the blocking temperature Tb of the antiferromagnetic layer formed of IrMn (e.g., about 300° C.), the exchange coupling magnetic field Hex direction of the exchange coupling film including the antiferromagnetic layer formed of IrMn is changed from the direction of the magnetic field in the 400° C. annealing to the direction of the magnetic field in the 300° C. annealing, whereby the bias application direction of the magnetic detection element 11B can be set to be a predetermined direction. At this time, the bias application direction of the magnetic detection element 11A cannot be aligned with the bias application direction of the magnetic detection element 11B because the effect of the external magnetic field at a temperature of about 300° C. on the exchange coupling magnetic field Hex of the exchange coupling film 10 of the magnetic-field-applying bias films 12A and 12B of the magnetic detection element 11A is slight. In this manner, the two magnetic detection elements 11A and 11B with different bias application directions can be provided.

Magnetic Detection Element According to Second Embodiment

Figure 8A:
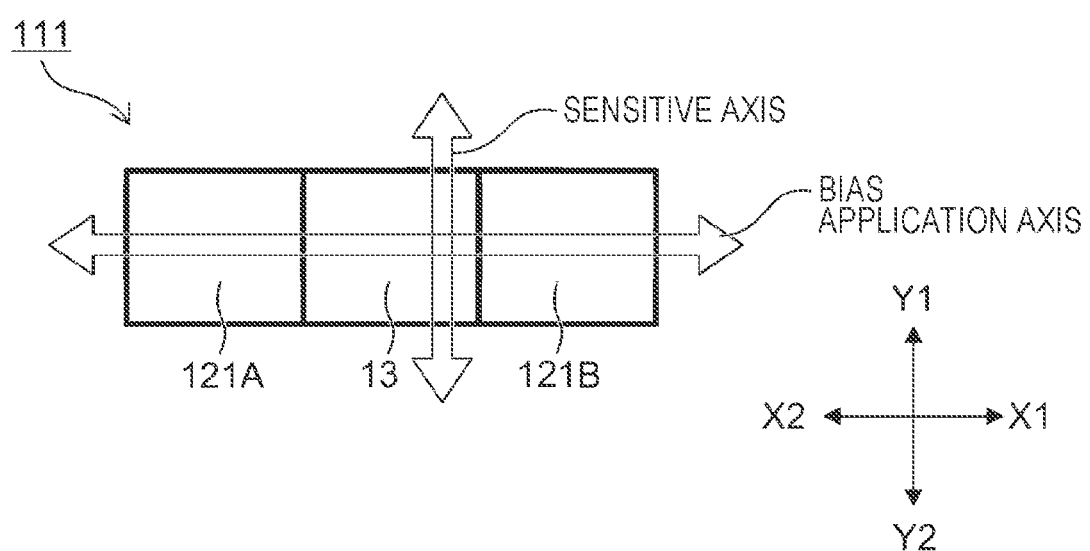

FIGS. 8A and 8B schematically illustrate a structure of a magnetic detection element according to a second embodiment of the present invention. In this embodiment, layers having the same functions as those in the magnetic detection element 11 illustrated in FIGS. 2A and 2B are denoted by like numerals, and descriptions thereof will be omitted.

A magnetic detection element 111 according to the second embodiment includes a magnetic detection unit 13 having a sensitive axis extending along Y1-Y2 direction in FIG. 8A, a magnetic-field-applying bias film 121A located on the X2 side in X1-X2 direction perpendicular to the sensitive axis of the magnetic detection unit 13, and a magnetic-field-applying bias film 121B located on the X1 side in X1-X2 direction of the magnetic detection unit 13.

The magnetic-field-applying bias films 121A and 121B have a basic structure common to that of the magnetic-field-applying bias films 12A and 12B of the magnetic detection element 11 according to the first embodiment. For example, a ferromagnetic layer 3 and an antiferromagnetic layer 41 constitute an exchange coupling film 101, but the antiferromagnetic layer 41 has a different structure.

The antiferromagnetic layer 41 of the magnetic-field-applying bias films 121A and 121B has an alternately stacked structure in which an X1Cr layer 41A and an X2Mn layer 41B are alternately stacked in three layers (where X1 and X2 each represent one or more elements selected from the group consisting of platinum-group elements and Ni, and X1 and X2 may be the same as or different from each other). These layers are each formed, for example, by a sputtering process or a CVD process. After being formed, the antiferromagnetic layer 41 is ordered by annealing and exchange-coupled with the ferromagnetic layer 3, thus generating an exchange coupling magnetic field Hex in the ferromagnetic layer 3.

FIG. 8B illustrates, as one aspect of an alternately stacked structure in which the X1Cr layer 41A and the X2Mn layer 41B are stacked in three or more layers, an antiferromagnetic layer 41 having a three-layer structure of X1Cr layer 41A/X2Mn layer 41B/X1 Cr layer 41A, one of the X1Cr layers 41A being in contact with the ferromagnetic layer 3. Alternatively, the X1Cr layer 41A and the X2Mn layer 41B may be interchanged to form a three-layer structure of X2Mn layer 41B/X1 Cr layer 41A/X2Mn layer 41B. In the case of this three-layer structure, one of the X2Mn layers 41B is in contact with the ferromagnetic layer 3. An embodiment in which the number of layers constituting the antiferromagnetic layer 41 is four or more will be described later.

When the X1Cr layer 41A is closest to the ferromagnetic layer 3, a thickness D1 of the X1Cr layer 41A on the protective layer 5 side is preferably larger than a thickness D3 of the X1Cr layer 41A in contact with the ferromagnetic layer 3 to provide a higher exchange coupling magnetic field Hex. The thickness D1 of the X1Cr layer 41A of the antiferromagnetic layer 41 is preferably larger than a thickness D2 of the X2Mn layer 41B. The ratio of thickness D1 to thickness D2 (D1:D2) is more preferably 5:1 to 100:1, still more preferably 10:1 to 50:1. The ratio of thickness D1 to thickness D3 (D1:D3) is more preferably 5:1 to 100:1, still more preferably 10:1 to 50:1.

In the case of the three-layer structure of X2Mn layer 41B/X1 Cr layer 41A/X2Mn layer 41B where the X2Mn layer 41B is closest to the ferromagnetic layer 3, a thickness D3 of the X2Mn layer 41B closest to the ferromagnetic layer 3 and a thickness D1 of the X2Mn layer 41B on the protective layer 5 side may be equal to each other.

To provide a higher exchange coupling magnetic field Hex, X1 of the X1Cr layer 41A is preferably Pt, and X2 of the X2Mn layer 41B is preferably Pt or Ir, more preferably Pt. When the X1Cr layer 41A is a PtCr layer, PtXCr100 at%−X where X is 45 at % or more and 62 at % or less is preferred, and PtXCr100 at %−X where X is 50 at % or more and 57 at % or less is more preferred. From the same viewpoint, the X2Mn layer 41B is preferably a PtMn layer.

Figure 9A:
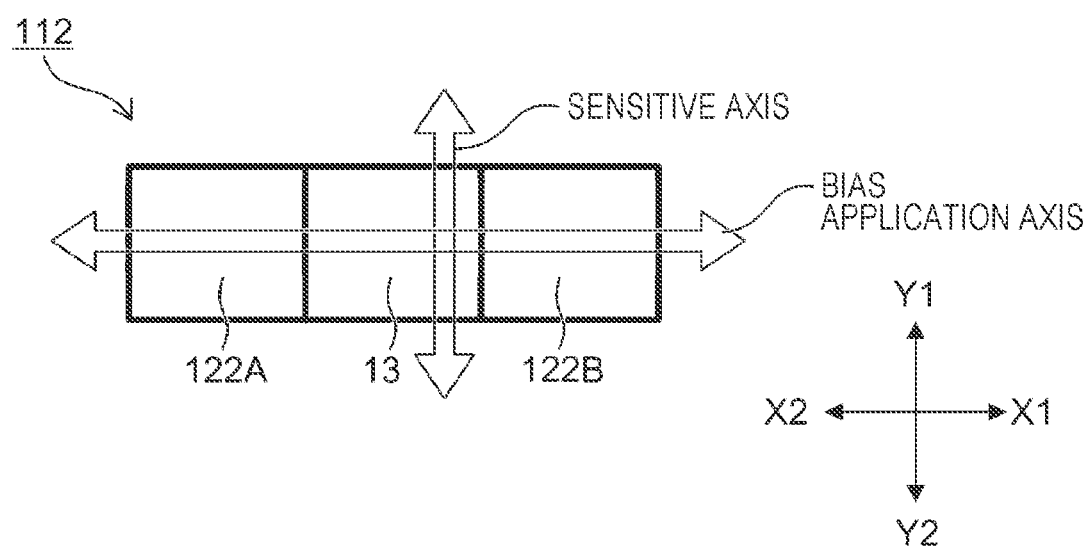

FIGS. 9A and 9B illustrate a film structure of a magnetic detection element 112 according to a modification of the second embodiment of the present invention. In this embodiment, layers having the same functions as those in the magnetic detection element 111 illustrated in FIGS. 8A and 8B are denoted by like numerals, and descriptions thereof will be omitted. In the magnetic detection element 112, a ferromagnetic layer 3 and an antiferromagnetic layer 42 constitute an exchange coupling film 101A.

The magnetic detection element 112 illustrated in FIGS. 9A and 9B differs from the magnetic detection element 111 in FIGS. 8A and 8B in that the number of layers constituting the antiferromagnetic layer 42 is four or more and that the antiferromagnetic layer 42 has a unit stack portion formed of a plurality of units stacked on top of each other, each unit being constituted by the X1Cr layer 41A and the X2Mn layer 41B (see FIG. 8B). In FIG. 9B, the antiferromagnetic layer 42 has a unit stack portion 4U1 to 4Un in which n units are stacked from a unit 4U1 constituted by an X1Cr layer 41A1 and an X2Mn layer 41B1 to a unit 4Un constituted by an X1Cr layer 41An and an X2Mn layer 41Bn (n is an integer of 2 or greater).

In the unit stack portion 4U1 to 4Un, the X1Cr layer 41A1 to the X1Cr layer 41An have the same thickness D1, and the X2Mn layer 41B1 to the X2Mn layer 41Bn also have the same thickness D2. By stacking the unit stack portion 4U1 to 4Un formed of the units having the same structure and annealing the resulting stack, a high exchange coupling magnetic field Hex is generated in the ferromagnetic layer 3 of the exchange coupling film 101A, and at the same time, the high-temperature stability of the antiferromagnetic layer 42 is improved.

While the antiferromagnetic layer 42 in FIG. 9B is constituted by the unit stack portion 4U1 to 4Un and the X1Cr layer 41A, with the X1Cr layer 41A being in contact with the ferromagnetic layer 3, the antiferromagnetic layer 42 may be constituted by the unit stack portion 4U1 to 4Un alone. In the antiferromagnetic layer 42 formed of a stack constituted by the unit stack portion 4U1 to 4Un alone, the X2Mn layer 41B1 is in contact with the ferromagnetic layer 3.

The number of stacked units in the unit stack portion 41U1 to 41Un can be set depending on how large the antiferromagnetic layer 42, the thickness D1, and the thickness D2 are. For example, when the thickness D2 is 5 to 15 Å, and the thickness D1 is 30 to 40 Å, the number of stacked units is preferably 3 to 15, more preferably 5 to 12, to provide a higher exchange coupling magnetic field Hex in a high-temperature environment.

Magnetic Sensor According to First Embodiment

Figure 10:
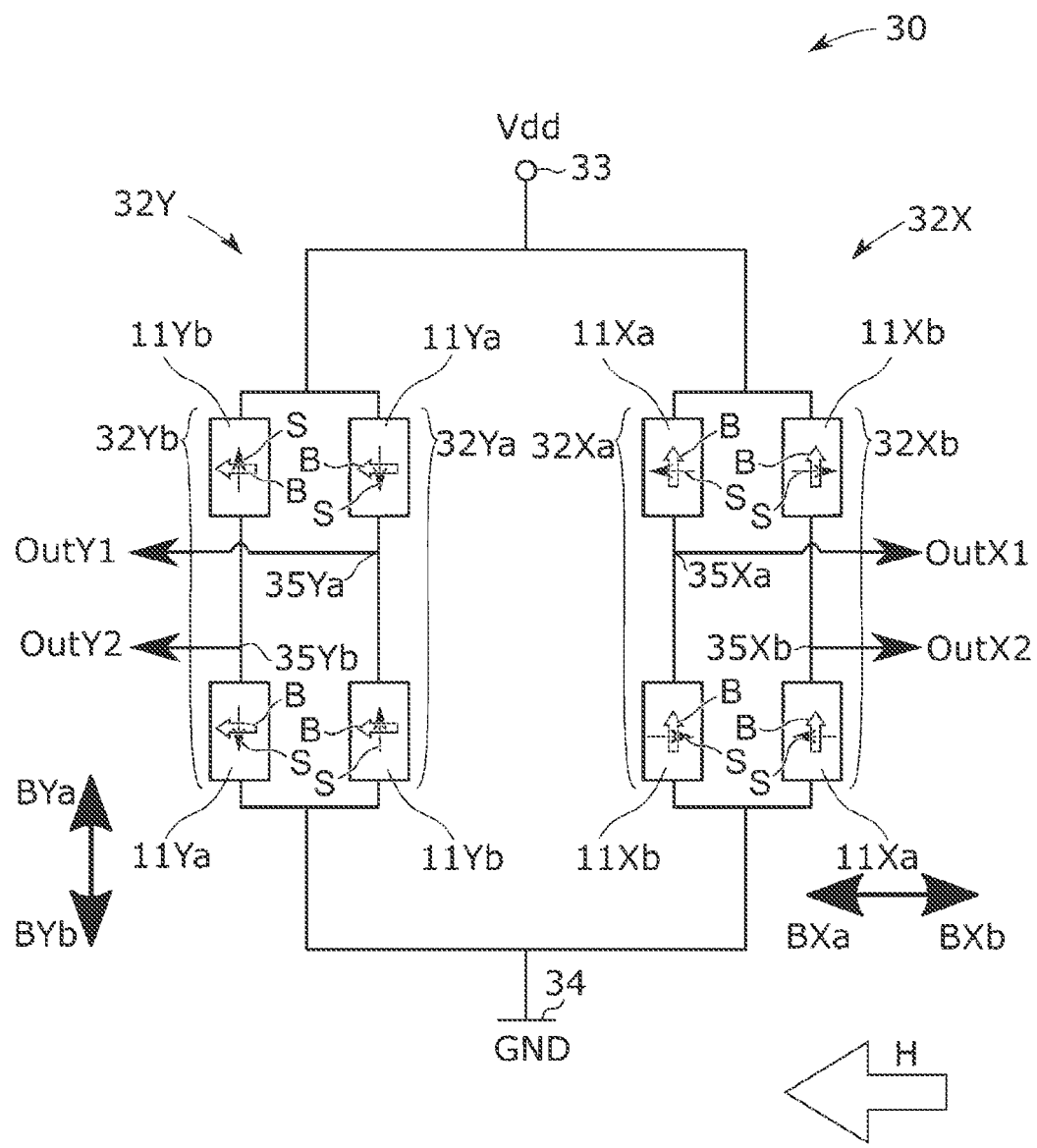
FIG. 10 is a circuit block diagram of a magnetic sensor 30 according to a first embodiment of the present invention.

Next, a magnetic sensor according to a first embodiment will be described. FIG. 10 illustrates a magnetic sensor (magnetic detector) 30 including a combination of the magnetic detection elements 11 illustrated in FIGS. 2A and 2B. In FIG. 10, the magnetic detection elements 11 having different sensitive axis directions S (indicated by black arrows in FIG. 10) are denoted by different numerals 11Xa, 11Xb, 11Ya, and 11Yb, for the sake of distinction. In the magnetic sensor 30, the magnetic detection elements 11Xa, 11Xb, 11Ya, and 11Yb are disposed on a single substrate.

The magnetic sensor 30 illustrated in FIG. 10 includes a full-bridge circuit 32X and a full-bridge circuit 32Y. The full-bridge circuit 32X includes two magnetic detection elements 11Xa and two magnetic detection elements 11Xb, and the full-bridge circuit 32Y includes two magnetic detection elements 11Ya and two magnetic detection elements 11Yb. The magnetic detection elements 11Xa, 11Xb, 11Ya, and 11Yb are each the magnetic detection element 11 illustrated in FIGS. 2A and 2B and each include a magnetic-field-applying bias film 12. Hereinafter, when these magnetic detection elements are not distinguished from each other, they are referred to as the magnetic detection elements 11 as appropriate.

In the full-bridge circuit 32X and the full-bridge circuit 32Y, the magnetic detection elements 11 having different sensitive axis directions S, as indicated by black arrows in FIG. 10, are used so that the circuits 32X and 32Y have different magnetic field detection directions. However, the circuits 32X and 32Y have the same magnetic field detection mechanism. Thus, in the following, the magnetic field detection mechanism will be described with reference to the full-bridge circuit 32X.

As indicated by white arrows in FIG. 10, bias application directions B of the magnetic detection elements 11Xa and 11Xb are all oriented toward the BYa side in BYa-BYb direction. This is because the magnetic detection elements 11Xa and 11Xb are configured as follows: the ferromagnetic layers 3 of the two magnetic-field-applying bias films 12A and 12B of each of the magnetic detection elements 11Xa and 11Xb each have an exchange coupling magnetic field direction (Hex direction) set to be oriented toward the BYa side in BYa-BYb direction, and in each of the magnetic detection elements 11Xa and 11Xb, the magnetic-field-applying bias film 12A, the magnetic detection unit 13, and the magnetic-field-applying bias film 12B are disposed so as to align in BYa-BYb direction. In contrast, bias application directions B of the magnetic detection elements 11Ya and 11Yb are all oriented toward the BXa side in BXa-BXb direction. This is because the magnetic detection elements 11Ya and 11Yb are configured as follows: the ferromagnetic layers 3 of the two magnetic-field-applying bias films 12A and 12B of each of the magnetic detection elements 11Ya and 11Yb each have an exchange coupling magnetic field direction (Hex direction) set to be oriented toward the BXa side in BXa-BXb direction, and is each of the magnetic detection elements 11Ya and 11Yb, the magnetic-field-applying bias film 12A, the magnetic detection unit 13, and the magnetic-field-applying bias film 12B are disposed so as to align in BXa-BXb direction.

The full-bridge circuit 32X includes a first series section 32Xa and a second series section 32Xb connected together in parallel. The first series section 32Xa includes one of the magnetic detection elements 11Xa and one of the magnetic detection elements 11Xb connected together in series, and the second series section 32Xb includes the other magnetic detection element 11Xb and the other magnetic detection element 11Xa connected together in series.

A power supply voltage Vdd is applied to a power supply terminal 33 shared by the magnetic detection element 11Xa of the first series section 32Xa and the magnetic detection element 11Xb of the second series section 32Xb. A ground terminal 34 shared by the magnetic detection element 11Xb of the first series section 32Xa and the magnetic detection element 11Xa of the second series section 32Xb is set to a ground potential GND.

A differential output (OutX1)–(OutX2) between an output potential (OutX1) at a midpoint 35Xa of the first series section 32Xa of the full-bridge circuit 32X and an output potential (OutX2) at a midpoint 35Xb of the second series section 32Xb is obtained as a detected output (detected output voltage) VXs in X direction.

The full-bridge circuit 32Y operates in the same manner as the full-bridge circuit 32X, and thus a differential output (OutY1)–(OutY2) between an output potential (OutY1) at a midpoint 35Ya of a first series section 32Ya and an output potential (OutY2) at a midpoint 35Yb of a second series section 32Yb is obtained as a detected output (detected output voltage) VYs in Y direction.

As indicated by the black arrows in FIG. 10, the sensitive axis directions S of the magnetic detection elements 11Xa and 11Xb of the full-bridge circuit 32X and the sensitive axis directions S of the magnetic detection elements 11Ya and 11Yb of the full-bridge circuit 32Y are perpendicular to each other.

In the magnetic sensor 30 illustrated in FIG. 10, the free magnetic layer of each magnetic detection element 11 is magnetized in a direction along the bias application direction B when an external magnetic field H is not applied. In response to application of an external magnetic field H, the direction of magnetization of the free magnetic layer of each magnetic detection element 11 changes so as to align with the direction of the external magnetic field H. In this event, the resistance value varies depending on the vector relationship between the pinned magnetization direction (sensitive axis direction S) of the ferromagnetic layer 3 and the magnetization direction of the free magnetic layer.

For example, if the external magnetic field H acts in a direction shown in FIG. 10, the electrical resistance value of the magnetic detection elements 11Xa of the full-bridge circuit 32X decrease because their sensitive axis direction S coincides with the direction of the external magnetic field H, whereas the electrical resistance values of the magnetic detection elements 11Xb increase because their sensitive axis direction is opposite to the direction of the external magnetic field H. As a result of the change in electrical resistance, the detected output voltage VXs=(OutX1)–(OutX2) is maximized. As the external magnetic field H changes rightward in the drawing plane (toward the BXb side in BXa-BXb direction), the detected output voltage VXs decreases. When the external magnetic field H is directed upward (toward the BYa side in BYa-BYb direction) or downward (toward the BYb side in BYa-BYb direction) in the drawing plane of FIG. 10, the detected output voltage VXs becomes zero.

On the other hand, in the full-bridge circuit 32Y, when the external magnetic field H is directed leftward in the drawing plane (toward the BXa side in BXa-BXb direction) as illustrated in FIG. 10, the direction of magnetization of the free magnetic layer (aligning with the bias application direction B) of every magnetic detection element 11 is perpendicular to the sensitive axis directions S (pinned magnetization directions), and thus the electrical resistance values of the magnetic detection elements 11Ya and 11Xb are the same. Therefore, the detected output voltage VYs is zero. If the external magnetic field H acts downward (toward the BYb side in BYa-BYb direction) in the drawing plane of FIG. 10, the detected output voltage VYs=(OutY1)–(OutY2) of the full-bridge circuit 32Y is maximized, and as the external magnetic field H changes upward (toward the BYa side in BYa-BYb direction) in the drawing plane, the detected output voltage VYs decreases.

As described above, as the direction of the external magnetic field H changes, the detected output voltages VXs and VYs of the full-bridge circuits 32X and 32Y change accordingly. Thus, the direction of movement of a detection target and the amount of its movement (its relative position) can be detected based on the detected output voltages VXs and VYs obtained from the full-bridge circuits 32X and 32Y.

FIG. 10 shows the magnetic sensor 30 configured to be able to detect magnetic fields in X direction and Y direction perpendicular to X direction. However, the magnetic sensor 30 may be configured to include either the full-bridge circuit 32X or the full-bridge circuit 32Y and detect only a magnetic field in X direction or Y direction.

Figure 11:
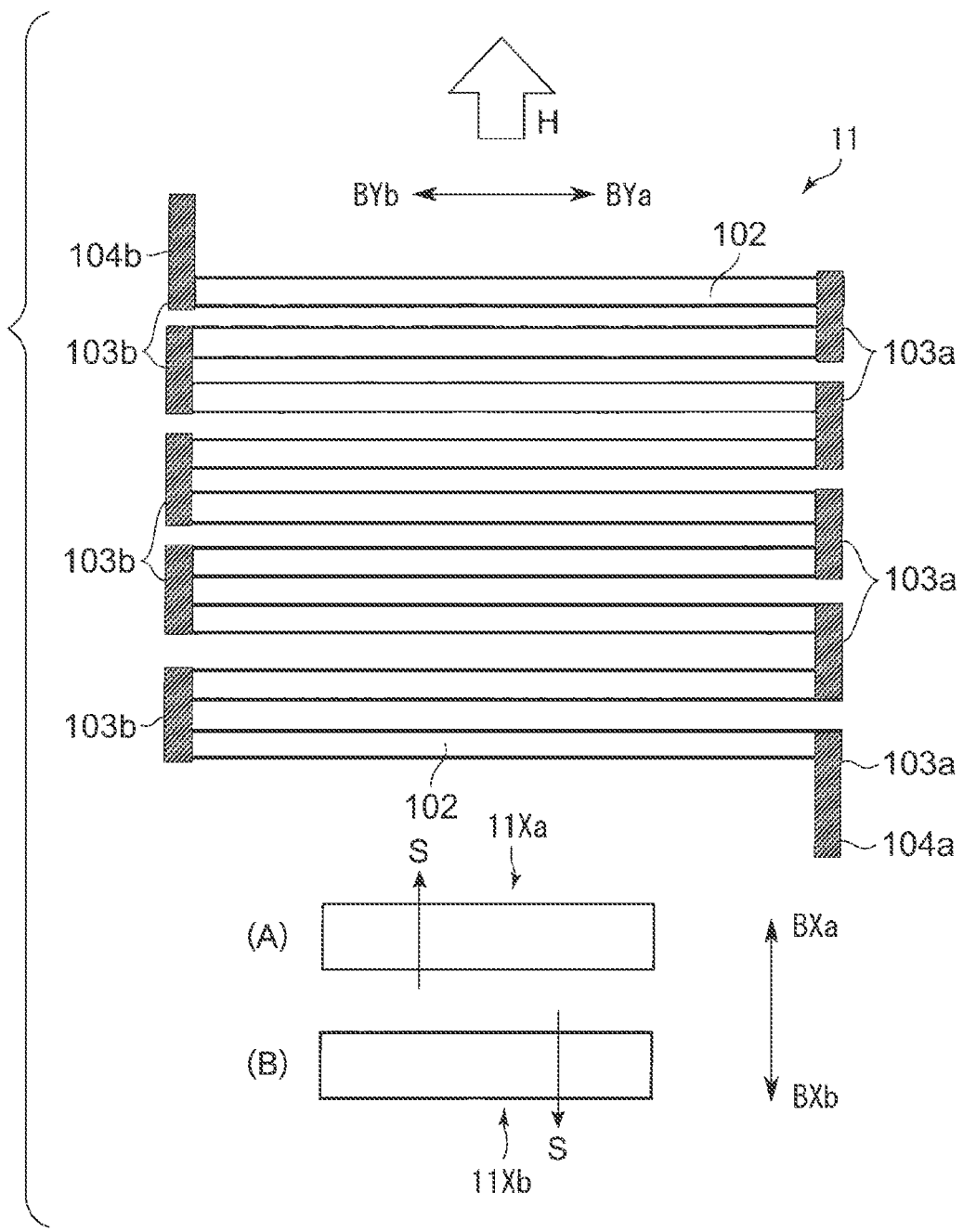
FIG. 11 is a plan view of a magnetic detection element 11 used in the magnetic sensor 30.

FIG. 11 illustrates planar structures of the magnetic detection elements 11Xa and 11Xb. In FIGS. 10 and 11, BXa-BXb direction corresponds to X direction. In (A) and (B) of FIG. 11, the pinned magnetization directions P of the magnetic detection elements 11Xa and 11Xb are indicated by arrows. The pinned magnetization directions P of the magnetic detection elements 11Xa and 11Xb extend in X direction and are opposite to each other. The pinned magnetization directions P align with the sensitive axis direction S.

As illustrated in FIG. 11, the magnetic detection unit 13 of each of the magnetic detection elements 11Xa and 11Xb has stripe-shaped element portions 102. The element portions 102 are each formed of a plurality of stacked metal layers (alloy layers), thus constituting a giant magnetoresistive (GMR) film. The longitudinal direction of the element portions 102 is aligned with BYa-BYb direction. The plurality of element portions 102 are disposed in parallel. Right ends, as seen in the figure, (ends on the BYa side in BYa-BYb direction) of adjacent element portions 102 are connected together through a conductive portion 103a, and left ends, as seen in the figure, (ends on the BYa side in BYa-BYb direction) of adjacent element portions 102 are connected together through a conductive portion 103b. At the right ends, as seen in the figure, (ends on the BYa side in BYa-BYb direction) and the left ends, as seen in the figure, (ends on the BYa side in BYa-BYb direction) of the element portions 102, the connection of the conductive portions 103a and the connection of the conductive portions 103b are alternately formed; that is, the element portions 102 are coupled to each other in a so-called meandering pattern. In the magnetic detection elements 11Xa and 11Xb, the conductive portion 103a at the lower right, as seen in the figure, is integrated with a connection terminal 104a, and the conductive portion 103b at the upper left, as seen in the figure, is integrated with a connection terminal 104b.

In the magnetic sensor 30 illustrated in FIGS. 10 and 11, the magnetoresistive film of the magnetic detection unit 13 can be replaced with a tunnel magnetoresistive (TMR) film.

Magnetic Sensor According to Second Embodiment

Figure 12:
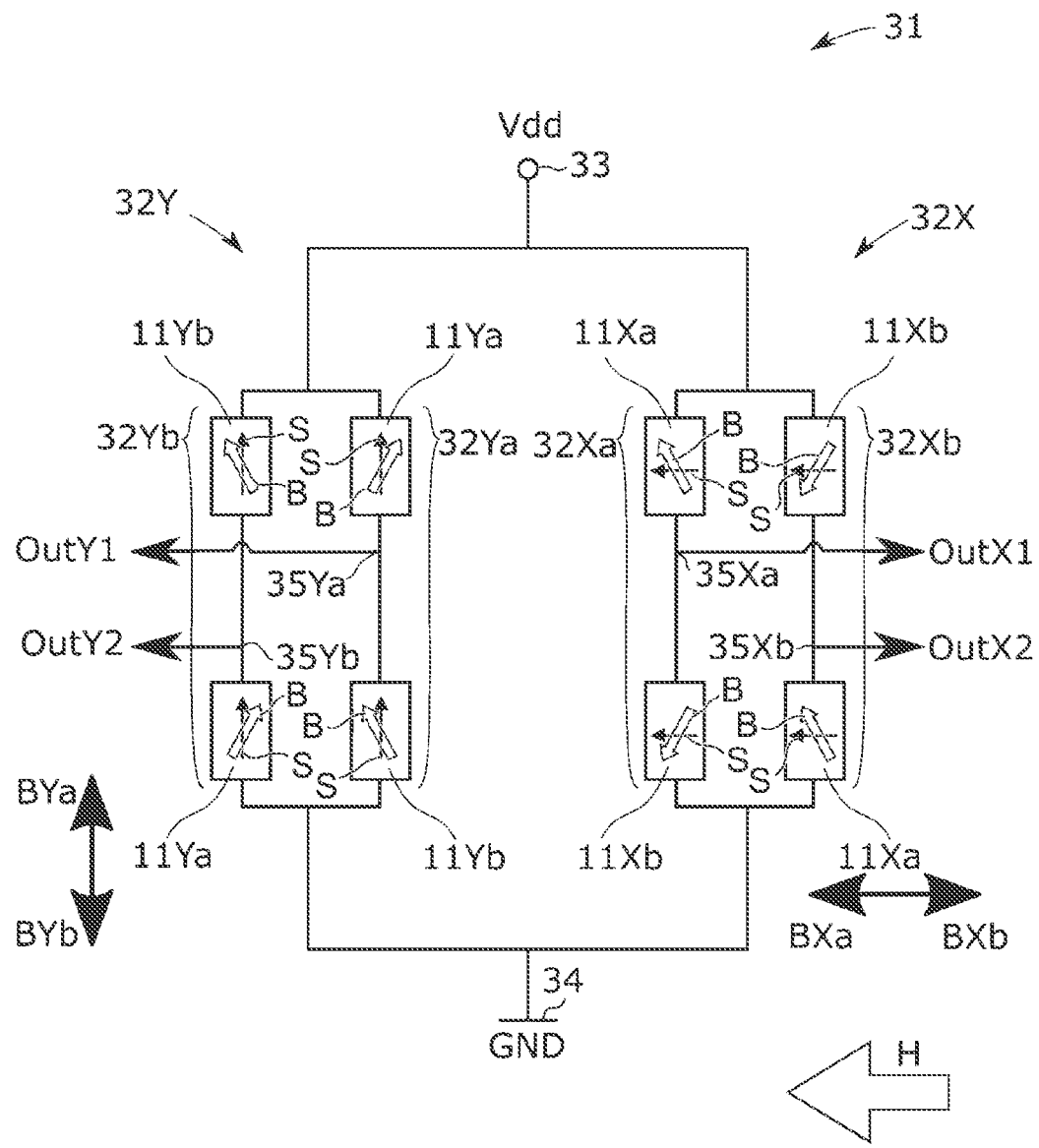
FIG. 12 is a circuit block diagram of a magnetic sensor 31 according to a second embodiment of the present invention.

FIG. 12 schematically illustrates a configuration of a magnetic sensor according to a second embodiment of the present invention. In this embodiment, layers having the same functions as those in the magnetic sensor 30 illustrated in FIG. 10 are denoted by like numerals, and descriptions thereof will be omitted.

A magnetic sensor 31 illustrated in FIG. 12 has sensitive axis directions S and bias application directions B different from those of the magnetic sensor 30 illustrated in FIG. 10. In the magnetic sensor 31, the sensitive axis directions S of the magnetic detection elements 11Xa and 11Xb are all oriented toward the BXa side in BXa-BXb direction. The bias application direction B of the magnetic detection elements 11Xa is inclined from the BXa side in BXa-BXb direction toward the BYa side in BYa-BYb direction. In contrast, the bias application direction B of the magnetic detection elements 11Xb is inclined from the BXa side in BXa-BXb direction toward the BYb side in BYa-BYb direction. These bias application directions B are achieved by any of the methods illustrated in FIGS. 6 and 7.

Likewise, the sensitive axis directions S of the magnetic detection elements 11Ya and 11Yb are all oriented toward the BYa side in BYa-BYb direction, but the bias application direction B of the magnetic detection elements 11Ya and the bias application direction B of the magnetic detection elements 11Yb are set to be oriented toward different directions by any of the methods illustrated in FIGS. 6 and 7.

By aligning the sensitive axis directions S of the magnetic detection elements 11Xa and 11Xb and aligning the sensitive axis directions S of the magnetic detection elements 11Ya and 11Yb as described above, the number of times of film formation in a magnetic field in producing the magnetic sensor 31 is reduced, and thus the magnetic sensor 31 tends to have improved offset properties.

The above embodiments have been described to facilitate understanding of the present invention and are not intended to limit the present invention. Thus, the individual elements disclosed in the above embodiments are intended to include all design changes and equivalents within the technical scope of the present invention. For example, in the above-described exchange coupling film, the PtMn layer 4A is in contact with the ferromagnetic layer 3, that is, the PtMn layer 4A is directly stacked on the stacked ferromagnetic layer 3, but another layer containing Mn (e.g., a Mn layer or an IrMn layer) may be stacked between the PtMn layer 4A and the ferromagnetic layer 3. In the above embodiments, the ferromagnetic layer 3 is closer to the base layer 1 than the antiferromagnetic layers 4, 41, and 42 are, but the antiferromagnetic layers 4, 41, and 42 may be closer to the base layer 1 than the ferromagnetic layer 3 is (see Example 1).

EXAMPLES

The present invention will now be described in more detail with reference to Examples, but these Examples are not intended to limit the scope of the present invention.

Example 1

A magnetic-field-applying bias film 12A having the following film structure was produced. In the following Example and Comparative Examples, numerical values in parentheses indicate thicknesses (Å). The magnetic-field-applying bias film 12A was annealed at 400° C. for 5 hours to cause exchange coupling between a ferromagnetic layer 3 and an antiferromagnetic layer 4.

Substrate/base layer 1: NiFeCr (42)/antiferromagnetic layer 4: [PtCr layer 4B: Pt50at%Cr50at% (280)/PtMn layer 4A: Pt50a%Mn50at% (20)]/ferromagnetic layer 3: Co90at%Fe10at% (100)/protective layer 6: Ta (90)

Comparative Example 1

A magnetic-field-applying bias film 12A was produced in the same manner as the film of Example 1 except that the antiferromagnetic layer 4 was formed of an IrMn layer: Ir20at%Mn80at5 (80), and the film 12A was annealed at 300° C. for 1 hour to cause exchange coupling between the ferromagnetic layer 3 and the antiferromagnetic layer 4.

Comparative Example 2

A magnetic-field-applying bias film 12A was produced in the same manner as the film of Example 1 except that the antiferromagnetic layer 4 was formed of an PtMn layer: Pt50at%Mn50at% (300), and the film 12A was annealed at 300° C. for 4 hours to cause exchange coupling between the ferromagnetic layer 3 and the antiferromagnetic layer 4.

Figure 13:
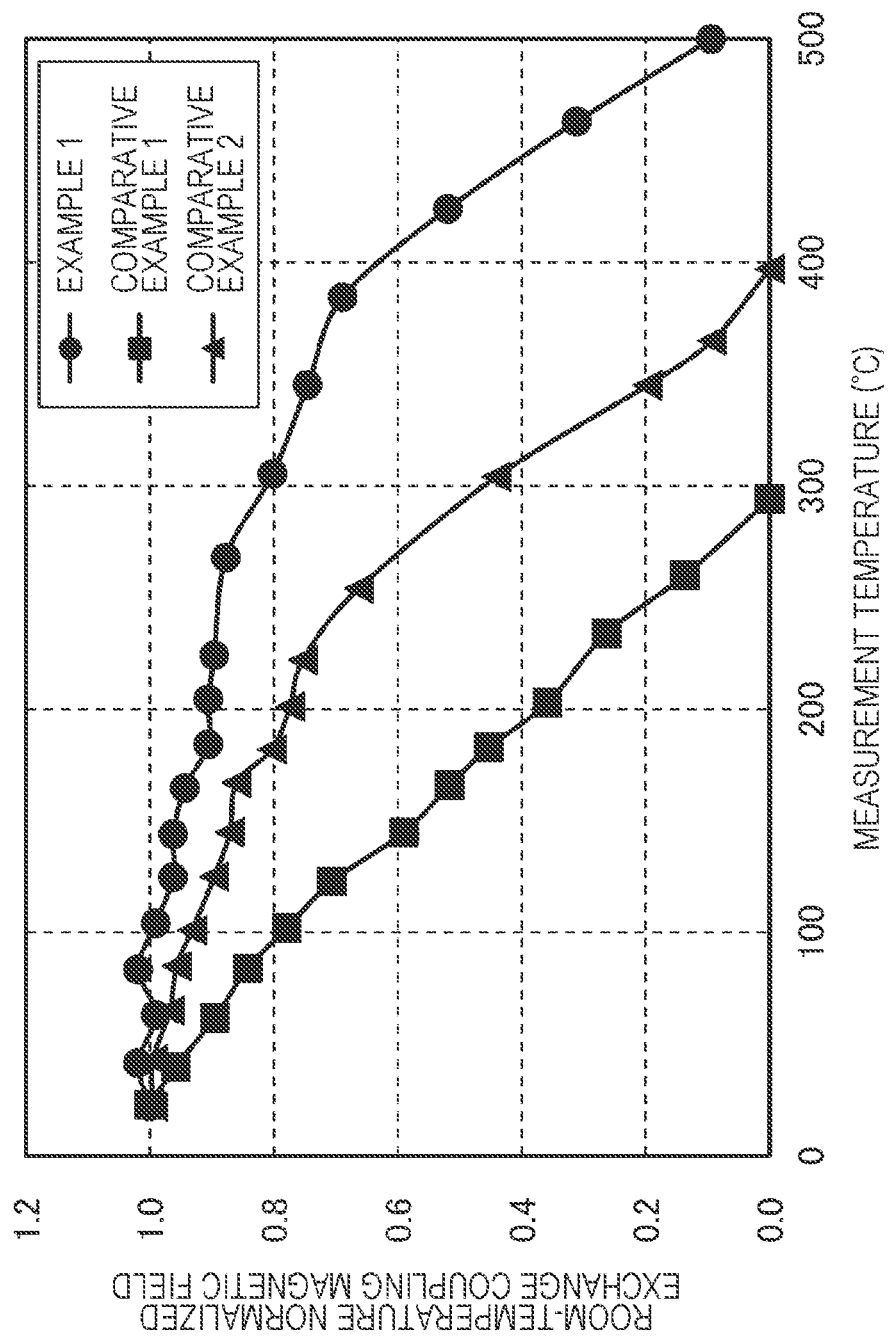
FIG. 13 is a graph showing the temperature dependence of the strength of exchange coupling magnetic fields Hex.

Using a vibrating sample magnetometer (VSM), a magnetization curve of each of the magnetic-field-applying bias films 12A of Example 1 and Comparative Examples 1 and 2 was measured at varying environment temperatures. From the hysteresis loop obtained, the exchange coupling magnetic field Hex (unit: Oe) at each temperature was determined. FIG. 13 shows a graph showing the relationship between values obtained by normalizing the exchange coupling magnetic field Hex at each temperature with respect to an exchange coupling magnetic field Hex at room temperature (room-temperature normalized exchange coupling magnetic fields) and measurement temperatures (unit: ° C.).

As shown in FIG. 13, the exchange coupling magnetic field Hex tended to decrease as the environment temperature increases. For the magnetic-field-applying bias film 12A of Example 1, the exchange coupling magnetic field Hex tended to decrease slowly, and as a result, the blocking temperature Tb was about 500° C. In contrast, the exchange coupling magnetic field Hex of the magnetic-field-applying bias film 12A of Comparative Example 1 tended to decrease rapidly, and its blocking temperature Tb was about 300° C. The blocking temperature Tb of the magnetic-field-applying bias film 12A of Comparative Example 2 was about 400° C.

What is claimed is:

1. A magnetic-field-applying bias film comprising an exchange coupling film, the exchange coupling film including: a ferromagnetic layer; and an antiferromagnetic layer stacked on the ferromagnetic layer; wherein: the antiferromagnetic layer includes an X(Cr—Mn) layer containing Mn, Cr, and one or more elements X selected from the group consisting of platinum-group elements and Ni, the X(Cr—Mn) layer has a first region relatively close to the ferromagnetic layer and a second region relatively far from the ferromagnetic layer, and a Mn content in the first region is higher than a Mn content in the second region, wherein the first region has a portion where a Mn/Cr ratio of Mn content to Cr content is 0.3 or more.

2. The magnetic-field-applying bias film according to claim 1, wherein the first region is in contact with the ferromagnetic layer.

3. The magnetic-field-applying bias film according to claim 1, wherein the first region has a portion where the Mn/Cr ratio is 1 or more.

4. The magnetic-field-applying bias film according to claim 1, wherein the antiferromagnetic layer comprises a stack of a PtCr layer and an $X^0$Mn layer (where $X^0$ represents one or more elements selected from the group consisting of platinum-group elements and Ni) that is closer to the ferromagnetic layer than the PtCr layer.

5. The magnetic-field-applying bias film according to claim 1, wherein the antiferromagnetic layer comprises a stack of a PtCr layer and a PtMn layer, the PtMn layer being closer to the ferromagnetic layer.

6. The magnetic-field-applying bias film according to claim 5, wherein an IrMn layer is further stacked such that the IrMn layer is closer to the ferromagnetic layer than the PtMn layer.

7. A magnetic-field-applying bias film comprising an exchange coupling film, the exchange coupling film including:
a ferromagnetic layer; and
an antiferromagnetic layer stacked on the ferromagnetic layer; wherein:
the antiferromagnetic layer has an alternately stacked structure in which an $X^1$Cr layer, where $X^1$ represents one or more elements selected from the group consisting of platinum-group elements and Ni, and an $X^2$Mn layer, where $X^2$ represents one or more elements selected from the group consisting of platinum-group elements and Ni and may be the same as or different from $X^1$, are alternately stacked in three or more layers and
wherein in the exchange coupling film, a normalized exchange coupling magnetic field obtained by dividing an exchange coupling magnetic field measured at 424° C. by an exchange coupling magnetic field measured at about 22° C. is 0.52 or more.

8. The magnetic-field-applying bias film according to claim 7, wherein $X^1$ is Pt, and $X^2$ is Pt or Ir.

9. A magnetic-field-applying bias film comprising an exchange coupling film, the exchange coupling film including:
a ferromagnetic layer; and
an antiferromagnetic layer stacked on the ferromagnetic layer; wherein:
the antiferromagnetic layer has an alternately stacked structure in which an $X^1$Cr layer (where $X^1$ represents one or more elements selected from the group consisting of platinum-group elements and Ni) and an $X^2$Mn layer (where $X^2$ represents one or more elements selected from the group consisting of platinum-group elements and Ni and may be the same as or different from $X^1$) are alternately stacked in three or more layers;
and wherein the antiferromagnetic layer has a unit stack portion formed of a plurality of units stacked on top of each other, each unit being constituted by the $X^1$Cr layer and the $X^2$Mn layer.

10. The magnetic-field-applying bias film according to claim 9, wherein in the unit stack portion, the $X^1$Cr layers have the same thickness, and the $X^2$Mn layers have the same thickness, the thickness of the $X^1$Cr layers being larger than the thickness of the $X^2$Mn layers.

11. The magnetic-field-applying bias film according to claim 10, wherein a ratio of the thickness of the $X^1$Cr layers to the thickness of the $X^2$Mn layers is 5:1 to 100:1.

12. A magnetic detection element comprising:
a magnetic detection unit including a magnetoresistive film, the magnetoresistive film including a pinned magnetic layer and a free magnetic layer; and
a magnetic-field-applying bias film comprising an exchange coupling film, the exchange coupling film including:
a ferromagnetic layer; and
an antiferromagnetic layer stacked on the ferromagnetic layer; wherein:
the antiferromagnetic layer includes an X(Cr—Mn) layer containing Mn, Cr, and one or more elements X selected from the group consisting of platinum-group elements and Ni,
the X(Cr—Mn) layer has a first region relatively close to the ferromagnetic layer and a second region relatively far from the ferromagnetic layer,
a Mn content in the first region is higher than a Mn content in the second region; and
the magnetic-field-applying bias film is disposed in a peripheral area of the magnetic detection unit so that the free magnetic layer is magnetized in an aligned direction in a state where no external magnetic field is applied to the free magnetic layer.

13. A magnetic detector comprising:
a magnetic detection element comprising:
a magnetic detection unit including a magnetoresistive film, the magnetoresistive film including a pinned magnetic layer and a free magnetic layer; and
a magnetic-field-applying bias film comprising an exchange coupling film, the exchange coupling film including:

a ferromagnetic layer; and an antiferromagnetic layer stacked on the ferromagnetic layer; wherein:

the antiferromagnetic layer includes an X(Cr—Mn) layer containing Mn, Cr, and one or more elements X selected from the group consisting of platinum-group elements and Ni, the X(Cr—Mn) layer has a first region relatively close to the ferromagnetic layer and a second region relatively far from the ferromagnetic layer, a Mn content in the first region is higher than a Mn content in the second region; and the magnetic-field-applying bias film is disposed in a peripheral area of the magnetic detection unit so that the free magnetic layer is magnetized in an aligned direction in a state where no external magnetic field is applied to the free magnetic layer.

14. The magnetic detector according to claim 13, wherein a plurality of the magnetic detection elements are disposed on a single substrate, and the plurality of the magnetic detection elements include pinned magnetic layers having different pinned magnetization directions.

15. A magnetic-field-applying bias film comprising an exchange coupling film, the exchange coupling film including:

a ferromagnetic layer; and an antiferromagnetic layer stacked on the ferromagnetic layer; wherein:

the antiferromagnetic layer has an alternately stacked structure in which an $X^1$Cr layer, where $X^1$ represents one or more elements selected from the group consisting of platinum-group elements and Ni, and an $X^2$Mn layer, where $X^2$ represents one or more elements selected from the group consisting of platinum-group elements and Ni and may be the same as or different from $X^1$, are alternately stacked in three or more layers; and the thickness of the $X^1$Cr layers being larger than the thickness of the $X^2$Mn layers.

\* \* \* \* \*